US011145630B2

(12) United States Patent
Lo et al.

(10) Patent No.: US 11,145,630 B2
(45) Date of Patent: Oct. 12, 2021

(54) LIGHT EMITTING DIODE PANEL AND MANUFACTURING METHOD THEREOF

(71) Applicant: Au Optronics Corporation, Hsinchu (TW)

(72) Inventors: Kuo-Lung Lo, Hsinchu County (TW); Pin-Miao Liu, Hsinchu County (TW); Jhao-Wun Chen, Hsinchu (TW); Tsung-Tien Wu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/544,925

(22) Filed: Aug. 20, 2019

(65) Prior Publication Data

US 2020/0266175 A1    Aug. 20, 2020

(30) Foreign Application Priority Data

Feb. 20, 2019    (TW) .................................. 108105698

(51) Int. Cl.
*H01L 27/15*    (2006.01)
*H01L 25/075*    (2006.01)
*H01L 21/66*    (2006.01)
*H01L 33/50*    (2010.01)
*H01L 33/62*    (2010.01)

(52) U.S. Cl.
CPC .......... *H01L 25/0753* (2013.01); *H01L 22/20* (2013.01); *H01L 33/505* (2013.01); *H01L 33/62* (2013.01); *H01L 2933/0041* (2013.01); *H01L 2933/0066* (2013.01)

(58) Field of Classification Search
CPC ...... H01L 27/15; H01L 27/153; H01L 27/156
See application file for complete search history.

(56) References Cited

U.S. PATENT DOCUMENTS

| 9,799,708 | B2 | 10/2017 | Hong et al. |
| 10,056,435 | B2 | 8/2018 | Hong et al. |
| 2016/0268352 | A1 | 9/2016 | Hong et al. |
| 2016/0351092 | A1* | 12/2016 | Chen .................... G09G 3/3233 |

(Continued)

FOREIGN PATENT DOCUMENTS

| CN | 105023522 | 11/2015 |
| CN | 107507926 | 12/2017 |

(Continued)

*Primary Examiner* — Jae Lee
(74) *Attorney, Agent, or Firm* — JCIPRNET

(57) ABSTRACT

A light emitting diode panel including a first substrate, a second substrate and a plurality of display units is provided. The display units are disposed between the first substrate and the second substrate. One display unit has multiple first regions and a second region surrounded by the first regions and includes multiple first light emitting diodes, multiple control signal lines and a second light emitting diode. Every N first light emitting diodes construct one pixel unit located within one of the first regions, wherein N is an integer greater than 1. The control signal lines are disposed on the first substrate and each extends toward one first light emitting diode. The second light emitting diode is disposed on the first substrate, located within the second region, and surrounded by the first regions. The second light emitting diode is electrically connected to one of the control signal lines.

12 Claims, 17 Drawing Sheets

(56) References Cited

U.S. PATENT DOCUMENTS

| | | | |
|---|---|---|---|
| 2016/0372535 A1* | 12/2016 | Lee | .................... H01L 27/3223 |
| 2018/0040677 A1 | 2/2018 | Hong et al. | |
| 2018/0358418 A1 | 12/2018 | Hong et al. | |
| 2019/0377223 A1* | 12/2019 | Lee | ................... G02F 1/133514 |
| 2020/0020676 A1* | 1/2020 | Cok | .................... H01L 25/0655 |

FOREIGN PATENT DOCUMENTS

| | | |
|---|---|---|
| CN | 109037274 | 12/2018 |
| TW | 201637194 | 10/2016 |

\* cited by examiner

LIGHT EMITTING DIODE PANEL AND MANUFACTURING METHOD THEREOF

CROSS-REFERENCE TO RELATED APPLICATION

This application claims the priority benefit of Taiwan application serial no. 108105698, filed on Feb. 20, 2019. The entirety of the above-mentioned patent application is hereby incorporated by reference herein and made a part of this specification.

BACKGROUND OF THE INVENTION

Field of the Invention

The invention relates to an electronic device, and in particular, to a light emitting diode panel.

Description of Related Art

Light emitting diodes have functions such as high luminous efficiency, power saving, and good reliability, and have been widely applied to various fields. In the application of a display, a technology of a display panel applied a micro light emitting diode as a display structure has been further developed. Regarding the manufacturing method of the micro light emitting diode panel, the manufactured micro light emitting diode array is bonded to the substrate by a batch transfer process, and the process is completed by assembling the substrate bonded with the micro light emitting diodes to the counter substrate.

The size of the micro light emitting diode is small, the side length of which is usually less than 1 mm. With the development of the technology, chips of the micro light emitting diodes smaller than 10 µm in length have been developed. Since the micro light emitting diode is not easy to be tested individually, and it is not easy to bond a single micro light emitting diode to the substrate independently, the micro light emitting diodes are mostly batch transferred to the substrate. Before the micro light emitting diodes are batch transferred onto the substrate, the micro light emitting diodes are not tested. Accordingly, some of the micro light emitting diodes transferred to the substrate may be damaged, invalid, or not successfully transferred. Therefore, after the micro light emitting diodes are batch transferred to the substrate, a testing step may be further performed and the micro light emitting diode that is determined as invalid or not successfully transferred may be repaired correspondingly, so as to achieve a desirable yield.

SUMMARY OF THE INVENTION

The invention provides a micro light emitting diode panel, having a repair structure for repairing so as to achieve a desirable yield.

An embodiment of the light emitting diode panel includes a first substrate, a second substrate, and a plurality of display units. The second substrate is assembled up and down with the first substrate. The display units are disposed between the first substrate and the second substrate. One of the display units has a plurality of first regions and a second region surrounded by the plurality of first regions. The display unit includes a plurality of first light emitting diodes, a plurality of control signal lines, and a second light emitting diode. The first light emitting diodes are disposed on the first substrate. Every N first light emitting diodes construct one pixel unit, and each of the pixel units is located within one of the first regions. N is an integer greater than 1. The control signal lines are disposed on the first substrate, and extend toward the plurality of first light emitting diodes respectively. The second light emitting diode is disposed on the first substrate, is located within the second region, and is surrounded by the first regions. The second light emitting diode is electrically connected to one of the control signal lines.

A manufacturing method of a light emitting diode panel of the invention includes the following steps. A plurality of first light emitting diodes and a second light emitting diode are transferred onto the first substrate, such that each of the first light emitting diodes is connected to one of the plurality of control signal lines disposed on the first substrate. Every N first light emitting diodes construct one pixel unit, and each of the pixel units is located within one first region. N is an integer greater than 1. The second light emitting diode is located within a second region, and the second region is surrounded by a plurality of first regions. A repair step is proceeded, such that the second light emitting diode is connected to one of the control signal lines. A repair light modulation layer is formed on the second substrate. The first substrate and the second substrate are assembled, such that the repair light modulation layer is stacked on the second light emitting diode.

Based on the above, apart from the first light emitting diodes predetermined to display images, the light emitting diode panel in accordance with the embodiment of the invention further includes the second light emitting diode for repair. In addition, the configuration region of the second light emitting diode is surrounded by the configuration regions of a plurality of first light emitting diodes. When the first light emitting diode predetermined to display images is detected as invalid, a repair method is to electrically connect the second light emitting diode to the corresponding control signal line of the invalid first light emitting diode, so that the second light emitting diode replaces the invalid first light emitting diode to display images. As such, the yield of the light emitting diode panel is ensured. Besides, any one of the plurality of first light emitting diodes disposed in the first regions surrounding the second light emitting diode may be repaired by using the second light emitting diode to achieve a better repair efficiency.

To provide a further understanding of the aforementioned and other features and advantages of the invention, exemplary embodiments, together with the reference drawings, are described in detail below.

DESCRIPTION OF THE EMBODIMENTS

Figure 1:
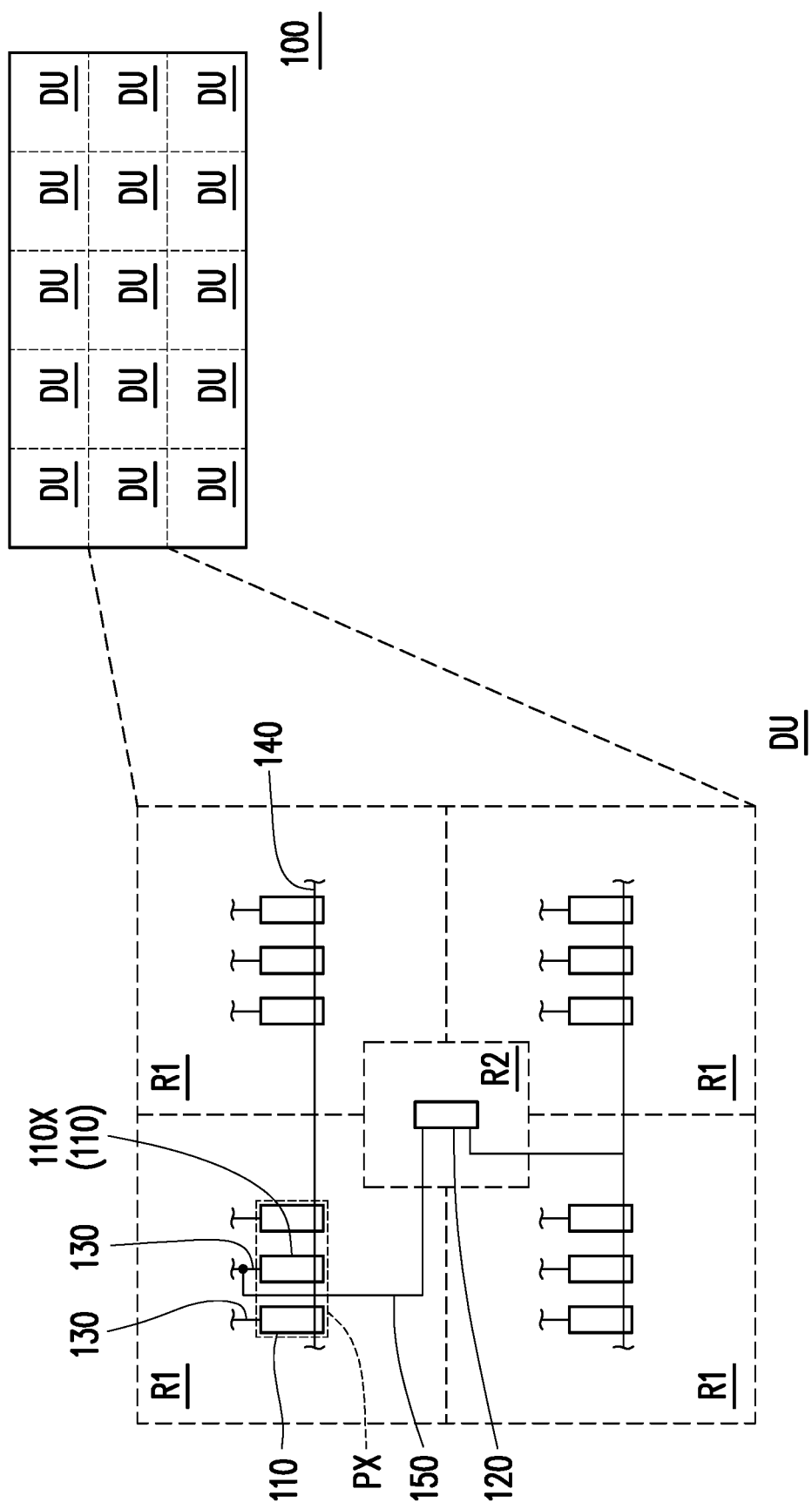
FIG. 1 is a top-view schematic diagram illustrating a top-view of a micro light emitting diode panel according to an embodiment of the invention.

FIG. 1 is a schematic diagram illustrating a top-view of a micro light emitting diode panel according to an embodiment of the invention. Please refer to FIG. 1. A light emitting diode panel 100 includes a plurality of display units DU. The plurality of display units DU are arranged in an array manner in the top-view. In addition, the display unit DU may be distributed throughout on the light emitting diode panel 100, and there is unnecessary to keep a border. However, the embodiment is not limited thereto. It may be acquired from a partial enlarged view of the display unit DU of FIG. 1 that a single display unit DU may include a plurality of first light emitting diodes 110 and a second light emitting diode 120. Specifically, each display unit DU is divided into a plurality of first regions R1 and a second region R2 surrounded by the plurality of first regions R1 according to the arrangement of the first light emitting diodes 110 and the second light emitting diode 120.

Every N first light emitting diodes 110 among the plurality of first light emitting diodes 110 construct one pixel unit PX, and each of the pixel units PX is disposed in one of the first regions R1. N is an integer greater than 1. In FIG. 1, N is 3 as an example. However, the invention is not limited thereto. That is, in this embodiment, each of the first regions R1 may be considered as a region in which three light emitting diodes 110 are disposed. The first light emitting diodes 110 may emit light of different colors and/or match different light modulation layers to present different pixel colors. For example, the three first light emitting diodes 110 in one single first region R1 may be configured to respectively represent the color combinations of the three colors of red, green, and blue to form one pixel unit PX. However, the invention is not limited thereto. In other alternative embodiments, N may be 2, 4 or other values, and the plurality of first light emitting diodes 110 in one single first region R1 may be used to present a color combination of the colors selected from red, green, blue, white and other colors.

One second light emitting diode 120 is disposed in the second region R2. In this embodiment, four first regions R1 surround the second region R2, and each of the first regions R1 is defined by the pixel unit PX. Hence, the second region R2 may be understood as a region surrounded by the plurality of pixel units PX. In this embodiment, there is no specific structure boundary between the first region R1 and the second region R2, and the boundary between the first region R1 and the second region R2 may be determined based on the arrangement of the pixel units PX.

Furthermore, each of the display units DU of the light emitting diode panel 100 further includes a plurality of control signal lines 130 and a plurality of common signal lines 140. The control signal lines 130 respectively extend toward the first light emitting diodes 110, and the first light emitting diodes 110 and the second light emitting diode 120 in one display unit DU all are connected to the common signal line 140. In FIG. 1, although the common signal line 140 is illustrated as a plurality of lines, in some embodiments, the common signal lines 140 may be formed by a continuous conductive layer or the common signal lines 140 may be directly electrically connected to each other. Moreover, when the light emitting diode panel 100 adopts an active drive design, each of the first light emitting diodes 110 is connected to an active element (not illustrated) through a corresponding control signal line 130. When the active element is a transistor, the active element may include a gate, a source, and a drain, and each of the control signal lines 130 is, for example, connected to the drain of the corresponding active element.

The first light emitting diodes 110 and the second light emitting diode 120 are all micro light emitting diodes. In addition, each of the micro light emitting diodes may include a light emitting diode chip and a first electrode and a second electrode (also known as a cathode and an anode) disposed on the light emitting diode chip. For instance, the anode of each of the first light emitting diodes 110 may be electrically connected to one of the corresponding control signal lines 130, whereas the cathode of each of the first light emitting diodes 110 and the second light emitting diode 120 is electrically connected to the common signal line 140.

When manufacturing the light emitting diode panel 100, the plurality of first light emitting diodes 110 and the second light emitting diode 120 in one display unit DU are collectively transferred onto the substrate (not illustrated) by a batch transfer process. The transferred light emitting diodes may be detected after all the display units DU in the light emitting diode panel 100 are manufactured. When any of the first light emitting diodes 110, for example, the first light emitting diode 110X here, is detected to be invalid or not successfully transferred (that is, the light emitting effect fails to reach the predetermined standard of the first light emitting diode,), a repair line 150 corresponding to the first light emitting diode 110X may be manufactured. By applying the repair line 150, the anode of the second light emitting diode 120 is connected to the corresponding control signal line 130 connected to the first light emitting diode 110X. In other words, in this embodiment, the second light emitting diode 120 may be electrically connected to one of the control signal lines 130, and this control signal line 130 extends toward the first light emitting diode 110X that is determined as invalid or not successfully transferred. Accordingly, the second light emitting diode 120 may replace the first light emitting diode 110 that is detected to be invalid or not successfully transferred to display so as to achieve the repair effect. Since the second region R2 is surrounded by the plurality of first regions R1, the second light emitting diode 120 within the second region R2 may be configured to repair any first light emitting diode 110 in the first regions R1 surrounding the second region R2.

In some embodiments, after the first light emitting diode 110X is detected to be invalid or not successfully transferred, apart from manufacturing the repair line 150, a light modulation layer may be selectively disposed on the second light emitting diode 120. In this way, after being matched with the light modulation layer, the color presented by the second light emitting diode 120 may be the same as the pixel color that is predetermined to be presented by the first light emitting diode 110X that is invalid or not successfully transferred. As such, all the pixel units PX may maintain normal display effects.

Figure 2:
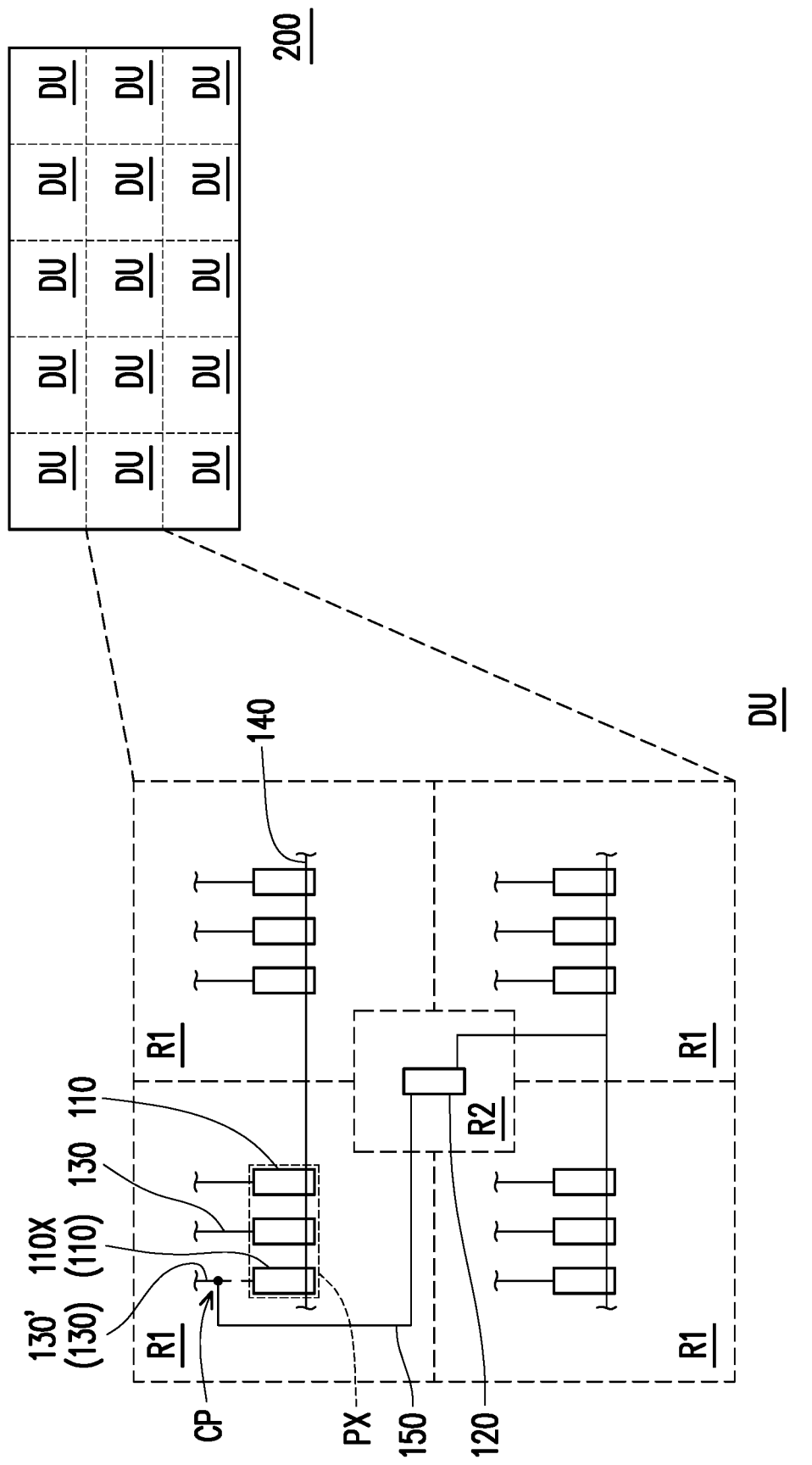
FIG. 2 is a schematic diagram illustrating a top-view of a light emitting diode panel according to another embodiment of the invention.

FIG. 2 is a schematic diagram illustrating a top-view of a light emitting diode panel according to another embodiment of the invention. Please refer to FIG. 2. A light emitting diode panel 200 is similar to the light emitting diode panel 100 of FIG. 1, having a plurality of display units DU, and each display unit DU is divided into a plurality of first regions R1 and a second region R2 surrounded by the plurality of first regions R1. The single display unit DU includes a plurality of first light emitting diodes 110, a second light emitting diode 120, a plurality of control signal lines 130, a common signal line 140, and a repair line 150. The configuration of the components may be referred to the related descriptions of FIG. 1. The difference between this embodiment and the embodiment of FIG. 1 is that the first light emitting diode 110X among the first light emitting diodes 110 is detected to be invalid, and a control signal line 130' is the control signal line originally designed to be connected to the first light emitting diode 110X. At the same time, the second light emitting diode 120 is connected to a control signal line 130' at a connection point CP of through the repair line 150, wherein the connection point CP of the control signal lines 130' is the point the repair line 150 connects to the control signal line 130'. In addition, the control signal lines 130' is broken off between the connection point CP and the corresponding first light emitting diode 110X. Therefore, the control signal lines 130' is a control signal line extending toward the first light emitting diode 110X, but is not directly connected to the first light emitting diode 110X.

Specifically, the manufacturing method of the light emitting diode panel 200 is substantially similar to the manufacturing method of the light emitting diode panel 100 of FIG. 1. However, after the first light emitting diode 110X in the light emitting diode panel 200 is detected to be invalid, apart from forming the repair line 150, such that the second light emitting diode 120 is connected to the corresponding control signal line 130', and the corresponding control signal lines 130' is further broken off. As such, the control signal lines 130' would not be electrically connected to the corresponding first light emitting diode 110X. The step of breaking off the control signal line 130' may be a laser cut or other methods capable of disconnecting the control signal line 130' from the first light emitting diode 110X.

Figure 3:
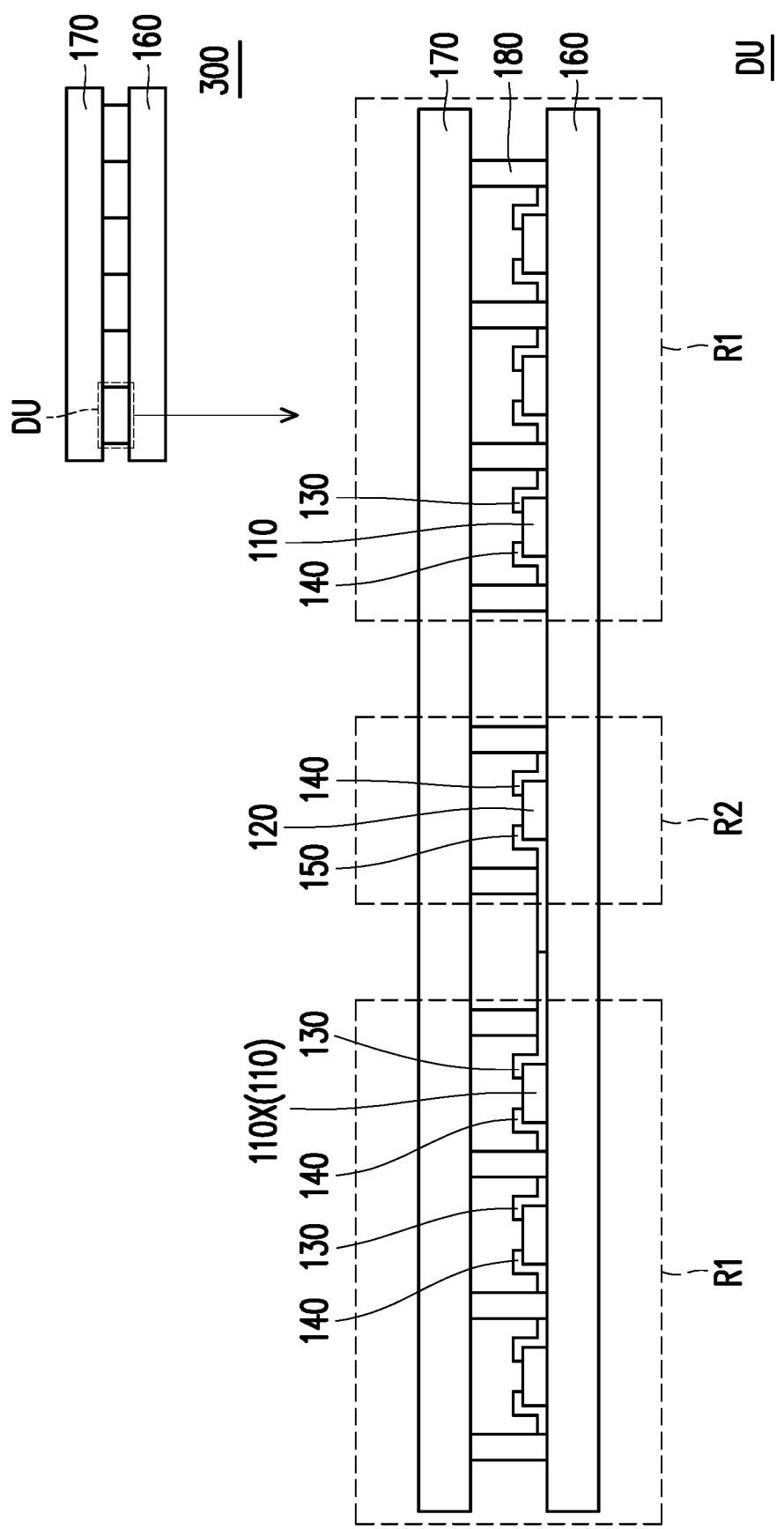
FIG. 3 is a schematic diagram illustrating a side-view of a light emitting diode panel according to an embodiment of the invention.

FIG. 3 is a schematic diagram illustrating a side-view of a light emitting diode panel according to an embodiment of the invention. Please refer to FIG. 3. A light emitting diode panel 300 may be served as an embodiment of the side view of the aforementioned light emitting diode panel 100 or 200. Hence, the same or similar components in these embodiments will be illustrated by the same or similar component symbols. Specifically, some components that are not illustrated in the top view, are presented in the side view. In FIG. 3, aside from the plurality of first light emitting diodes 110, the second light emitting diode 120, the plurality of control signal lines 130, the common signal line 140, and the repair line 150, the light emitting diode panel 300 further includes a first substrate 160, a second substrate 170, and a rib 180. However, in some embodiments, the rib 180 may be omitted, whereas the first substrate 160 and the second substrate 170 may be up and down assembled together by a sealant (not illustrated) or other assembly structures. The first light emitting diodes 110, the second light emitting diode 120, the control signal lines 130, the common signal line 140 and the repair line 150 are disposed on the first substrate 160. The rib 180 is disposed between the first substrate 160 and the second substrate 170, so as to support a gap between the first substrate 160 and the second substrate 170.

In FIG. 3, one side of each of the first light emitting diodes 110 and the second light emitting diode 120 is bonded on the first substrate 160, and the control signal lines 130, the common signal line 140, and the repair line 150 all extend to the other side of each of the first light emitting diodes 110 and the second light emitting diode 120 respectively. In other words, the first light emitting diode 110 and the second light emitting diode 120 illustrated in FIG. 3 are each illustrated as an example of a lateral type of the light emitting diode. However, in other alternative embodiments, the first light emitting diodes 110 and the second light emitting diode 120 may be selectively to be flip chip type light emitting diodes. If a flip chip type light emitting diode is adopted, the control signal lines 130, the common signal line 140, and the repair line 150 are located between the first light emitting diodes 110 and the first substrate 160.

The manufacturing method of the light emitting diode panel 300 may include the following steps and may be applied to the aforementioned light emitting diode panel 100 or 200. However, the invention is not limited thereto. First, the plurality of first light emitting diodes 110 and the second light emitting diode 120 are transferred onto the first substrate 160. The method of transferring the first light emitting diodes 110 and the second light emitting diode 120 may include a batch transfer process. That is, the first light emitting diodes 110 and the second light emitting diode 120 may be premanufactured and the premanufactured light emitting diodes may be carried by a carrier plate. Then, by using a pickup tool, for example, a PDMS template, a vacuum pickup tool, or the like, a plurality of light emitting diodes are picked up from the carrier plate simultaneously, and a plurality of light emitting diodes that are simultaneously picked are placed and bonded to the first substrate 160. The transfer process of the light emitting diodes is completed after all the display units DU on the first substrate 160 are bonded with the predetermined numbers of the light emitting diodes.

In this embodiment, before the light emitting diodes are transferred to the first substrate 160, the control signal lines 130 and the common signal line 140 are manufactured onto the first substrate 160. Before, after, or during the step of transferring the light emitting diodes, the step of forming a conductive connector (not illustrated) may be proceeded, such that each of the first light emitting diodes 110 is connected to the plurality of control signal lines 130 and the common signal line 140 disposed onto the first substrate 160, and such that the second light emitting diode 120 is connected to the common signal line 140 disposed on the first substrate 160. The first light emitting diodes 110 are respectively connected to the plurality of control signal lines 130 and the common signal line 140 that are disposed on the first substrate 160 through the corresponding conductive connectors (not illustrated). The second light emitting diode 120 is connected to the common signal line 140 through the corresponding conductive connector (not illustrated). Here, the conductive connector (not illustrated) may include a conductive layer, a conductive solder, a bonding wire, or the like. However, the invention is not limited thereto.

Afterwards, a detecting step may be proceeded to detect whether an invalid light emitting diode exists among the first light emitting diodes 110. If no invalid light emitting diode is detected, the first substrate 160 and the second substrate 170 may be assembled to complete the light emitting diode panel. If a light emitting diode that is invalid or not successfully transferred is detected, for example, the first light emitting diode 110X, the repair step is proceeded. The repair step may include forming the repair line 150 to connect the second light emitting diode 120 to one of the control signal lines 130, that is, the one of the control signal lines 130 corresponding to the first light emitting diode 110X. In this way, the second light emitting diode 120 may receive the signal predetermined to be transmitted to the first light emitting diode 110X for light emission. Afterwards, the first substrate 160 and the second substrate 170 are assembled to complete the light emitting diode panel 300. Although FIG. 3 illustrates the control signal line 130 to which the repair line 150 is connected is continuously extended to contact the first light emitting diode 110X, in some embodiments, the control signal line 130 to which the repair line 150 is connected may be disconnected from the first light emitting diode 110X.

In some embodiments, the first light emitting diode 110X and the second light emitting diode 120 may emit light of the same wavelength range (present the same color). For example, the first light emitting diode 110X that is invalid or not successfully transferred is, for example, a blue light emitting diode, and the second light emitting diode 120 is also a blue light emitting diode. Hence, the second light emitting diode 120 itself may replace the first light emitting diode 110X that is invalid or not successfully transferred, and provides the same color of light. In other embodiments, if the color of the light emitted from the second light emitting diode 120 is different from the predetermined color that the first light emitting diode 110X presents, a repair step may further include forming the repair light modulation layer on the second light emitting diode 120.

Figure 4:
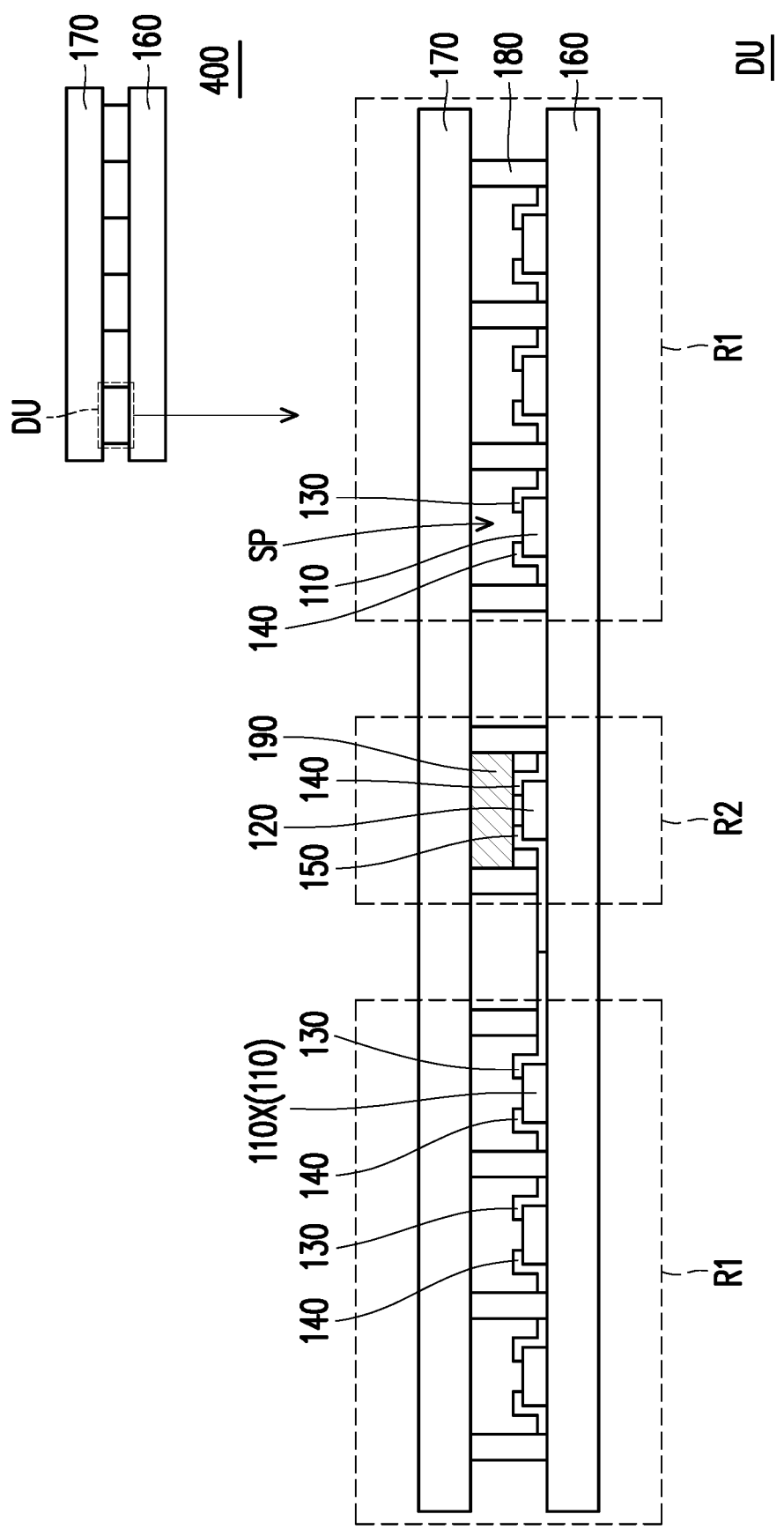
FIG. 4 is a schematic diagram illustrating a side-view of a light emitting diode panel according to still another embodiment of the invention.

FIG. 4 is a schematic diagram illustrating a side-view of a light emitting diode panel according to still another embodiment of the invention. In FIG. 4, a light emitting diode panel 400 is substantially similar to the light emitting diode panel 300 depicted in FIG. 3, and includes a plurality of first light emitting diodes 110, a second light emitting diode 120, a plurality of control signal lines 130, a common signal line 140, a repair line 150, a first substrate 160, a second substrate 170, and a rib 180. In addition, the configuration of these components may be referred to the related descriptions of FIG. 3. The difference between this embodiment and the embodiment of FIG. 3 is that the light emitting diode panel 400 further includes a repair light modulation layer 190. Specifically, the repair light modulation layer 190 is disposed between the second substrate 170 and the second light emitting diode 120, and the repair light modulation layer 190 is stacked on the second light emitting diode 120. In some embodiments, the repair light modulation layer 190 is disposed on the second substrate 170, but is not limited thereto.

The manufacturing method of the light emitting diode panel 400 may include all the steps of the manufacturing method of the aforementioned light emitting diode panel 300, and further includes the steps of forming the repair light modulation layer 190 on the second substrate 170 corresponding to the configuration position of the second light emitting diode 120. In this embodiment, when the first light emitting diodes 110 are transferred on the first substrate 160 and are connected to the corresponding control signal lines 130 and the common signal line 140, a detection of the light emitting diodes is proceeded. In the case that the first light emitting diode 110X is detected to be invalid or not successfully transferred, apart from forming the repair line 150 so as to connect the second light emitting diode 120 and the corresponding control signal line 130, the repair light modulation layer 190 corresponding to the configuration position of the second light emitting diode 120 is further formed on the second substrate 170.

The repair light modulation layer 190 has the function of changing, adjusting or filtering the wavelength range of light passing through it, and may be configured to collaborate with the second light emitting diode 120 to present a desired color. By the selection of the type of the repair light modulation layer 190, the light emitted from the second light emitting diode 120 is modulated to present a color that is predetermined to be presented by the first light emitting diode 110X that is invalid or not successfully transferred, so as to achieve the repair effect.

For example, when a sub-pixel color of the first light emitting diode 110X that is invalid or not successfully transferred is predetermined to be red, the type of the repair light modulation layer 190 may be so selected that the light emitted by the second light emitting diode 120 and passing through the repair light modulation layer 190 presents red. Likewise, when the sub-pixel color of the first light emitting diode 110X that is invalid or not successfully transferred is predetermined to be blue or green, the type of the repair light modulation layer 190 may be so selected that the light emitted by the second light emitting diode 120 and passing through the repair light modulation layer 190 presents blue or green.

For another example, when the second light emitting diode 120 is a white light emitting diode, the repair light modulation layer 190 may be a color filter layer. When the second light emitting diode 120 is a blue light emitting diode or an ultraviolet light emitting diode, the repair light modulation layer 190 may be a wavelength conversion layer. The color filter layer may be a component that filters the wavelength of light to allow light of a particular wavelength range to pass through the color filter while absorbing or blocking the light in other wavelength ranges, and the material of the color filter includes dyes, pigment, light absorbing materials having certain wavelength, and so on. The wavelength conversion layer may be a component, capable of absorbing light in a certain wavelength range and emitting light in another wavelength range, and the material of the wavelength conversion layer includes fluorescent materials, quantum dot materials, phosphorescent materials, etc.

Moreover, before manufacturing the repair light modulation layer 190 onto the second substrate 170, the rib 180 may be manufactured on the second substrate 170 in advance. The rib 180 surrounds a plurality of configuration spaces SP, and each of configuration spaces SP corresponds to one of the first light emitting diodes 110 and the second light emitting diode 120. When the repair light modulation layer 190 is manufactured afterwards, light modulating materials (such as color filter materials, light absorbing materials, fluorescent materials, phosphorescent materials, or quantum dot materials) are formed in the configuration space SP corresponding to the second light emitting diode 120 by inkjet, lithography, printing, or the like. Therefore, the repair light modulation layer 190 may be surrounded by the rib 180.

After the repair light modulation layer 190 is formed on the second substrate 170, the first substrate 160 and the second substrate 170 are assembled to construct the light emitting diode panel 400. Here, the assembly of the first substrate 160 and the second substrate 170 includes, for example, stacking the repair light modulation layer 190 on the second light emitting diode 120. In addition, both of the first light emitting diodes 110 and the second light emitting diode 120 are disposed between the first substrate 160 and the second substrate 170.

Figure 5:
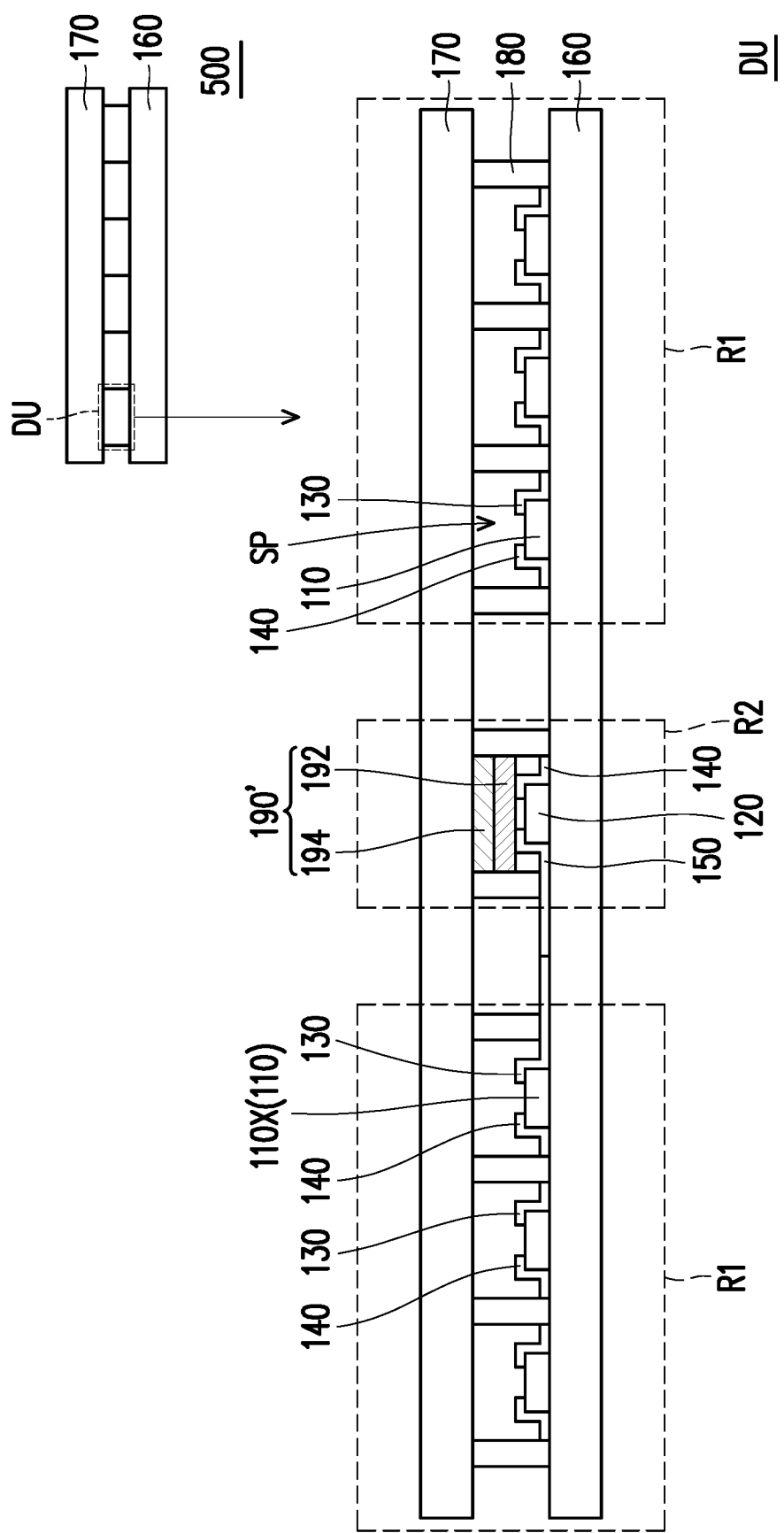
FIG. 5 is a schematic diagram illustrating a side-view of a light emitting diode panel according to yet another embodiment of the invention.

FIG. 5 is a schematic diagram illustrating a side-view of a light emitting diode panel according to yet another embodiment of the invention. A light emitting diode panel 500 of FIG. 5 is substantially similar to the light emitting diode panel 400 of FIG. 4, and includes a plurality of first light emitting diodes 110, a second light emitting diode 120, a plurality of control signal lines 130, a common signal line 140, a repair line 150, a first substrate 160, a second substrate 170, and a rib 180. In addition, the configuration of these components may be referred to the related descriptions of FIG. 4. The difference between this embodiment and the embodiment of FIG. 4 is that a repair light modulation layer 190' included in the light emitting diode panel 500 includes a first sub layer 192 and a second sub layer 194. One of the first sub layer 192 and the second sub layer 194 is a color filter layer, and the other is a wavelength conversion layer.

In this embodiment, the wavelength range of the light emitted by the second light emitting diode 120 is, for example, adapted to excite the wavelength conversion layer, such that the wavelength conversion layer converts the wavelength range of the light emitted by the second light emitting diode 120 into another wavelength range and then emits. For instance, the second light emitting diode 120 may be a blue light emitting diode or an ultraviolet light emitting diode. However, the invention is not limited thereto. Furthermore, the color filter layer of this embodiment may be applied to filter the wavelength range of the light emitted by the second light emitting diode 120 and the wavelength range of the light emitted by the wavelength conversion layer. As stated in the previous embodiment, the repair light modulation layer 190' is configured to adjust or change the color of light emitted by the second light emitting diode 120, such that the color of the adjusted or changed light is the same as the predetermined color provided by the first light emitting diode 110X that is invalid or not successfully transferred.

Figure 6:
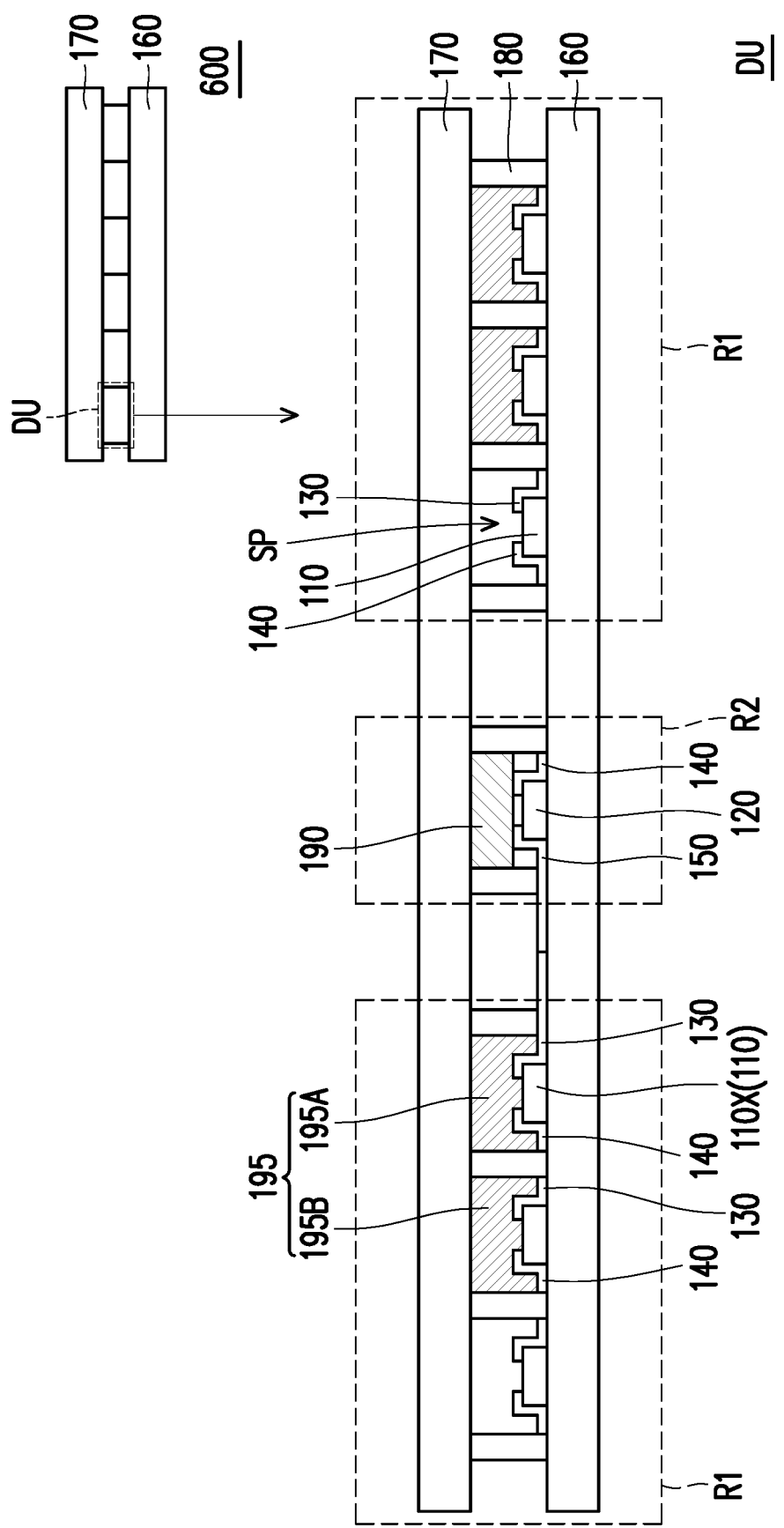
FIG. 6 is a schematic diagram illustrating a side-view of a light emitting diode panel according to still another embodiment of the invention.

FIG. 6 is a schematic diagram illustrating a side-view of a light emitting diode panel according to still another embodiment of the invention. A light emitting diode panel 600 of FIG. 6 is substantially similar to the light emitting diode panel 400, and includes a plurality of first light emitting diodes 110, a second light emitting diode 120, a plurality of control signal lines 130, a common signal line 140, a repair line 150, a first substrate 160, a second substrate 170, a rib 180, and a repair light modulation layer 190. The configuration of the components may be referred to the related descriptions of FIG. 4. The difference between this embodiment and the embodiment of FIG. 4 is that the light emitting diode panel 600 further includes a pixel light modulation layer 195. The pixel light modulation layer 195 is disposed on the second substrate 170. The number of the pixel light modulation layer 195 is plural, and each pixel light modulation layer 195 is stacked on one of the first light emitting diodes 110. In this embodiment, the pixel light modulation layer 195 may be disposed at least corresponding to parts of the first light emitting diodes 110, such that each of the first light emitting diodes 110 is configured to present the predetermined color.

For example, when there are three first light emitting diodes 110 disposed in a single first region R1, one of the first light emitting diodes 110 may not collaborate with the pixel light modulation layer, another first light emitting diode 110 may collaborate with a pixel light modulation layer 195A, and the remaining first light emitting diodes 110 collaborates with a pixel light modulation layer 195B. The pixel light modulation layer 195A may be applied to change or filter the wavelength range of the light emitted by the corresponding first light emitting diode 110 to present a first color. The pixel light modulation layer 195B may be applied to change or filter the wavelength range of the light emitted by the corresponding first light emitting diode 110 to present a second color. The wavelength range of the light emitted by the corresponding first light emitting diode 110 that does not collaborate with the pixel light modulation layer 195 is adapted to present a third color. The first color, the second color, and the third color may be different from each other; for example, may be respectively red, green, and blue. Meanwhile, by adjusting luminance ratio of the three colors, a display of different grayscales may be realized. All of the first light emitting diodes 110 in this embodiment may all be blue light emitting diodes. However, the invention is not limited thereto. In other embodiments, all of the first light emitting diodes 110 may all correspond to the single pixel light modulation layer 195, and all of the first light emitting diodes 110 may be white light emitting diodes, blue light emitting diodes, or ultraviolet light emitting diodes.

The second light emitting diode 120 is configured to repair the first light emitting diode 110X that is invalid or not successfully transferred. The color of the light emitted by the second light emitting diode 120 and passing through the corresponding repair light modulation layer 190 is the same as the color of the light emitted by the first light emitting diode 110X and passing through the corresponding pixel light modulation layer 195A. In some embodiments, the repair light modulation layer 190 and the pixel light modulation layer 195A may be color filter layers made of the same material. In some embodiments, the repair light modulation layer 190 and the pixel light modulation layer 195 may be manufactured by an inkjet printing manner and a lithography manner respectively.

The first light emitting diode 110X and the second light emitting diode 120 may both be white light emitting diodes, whereas the repair light modulation layer 190 and the pixel light modulation layer 195 may both be color filter layers. Furthermore, in other embodiments, the first light emitting diode 110X and the second light emitting diode 120 may both be blue light emitting diodes or ultraviolet light emitting diodes, and each of the repair light modulation layer 190 and the pixel light modulation layer 195 may include a wavelength conversion layer or constructed by a lamination of the wavelength conversion layer and the color filter layer.

Figure 7:
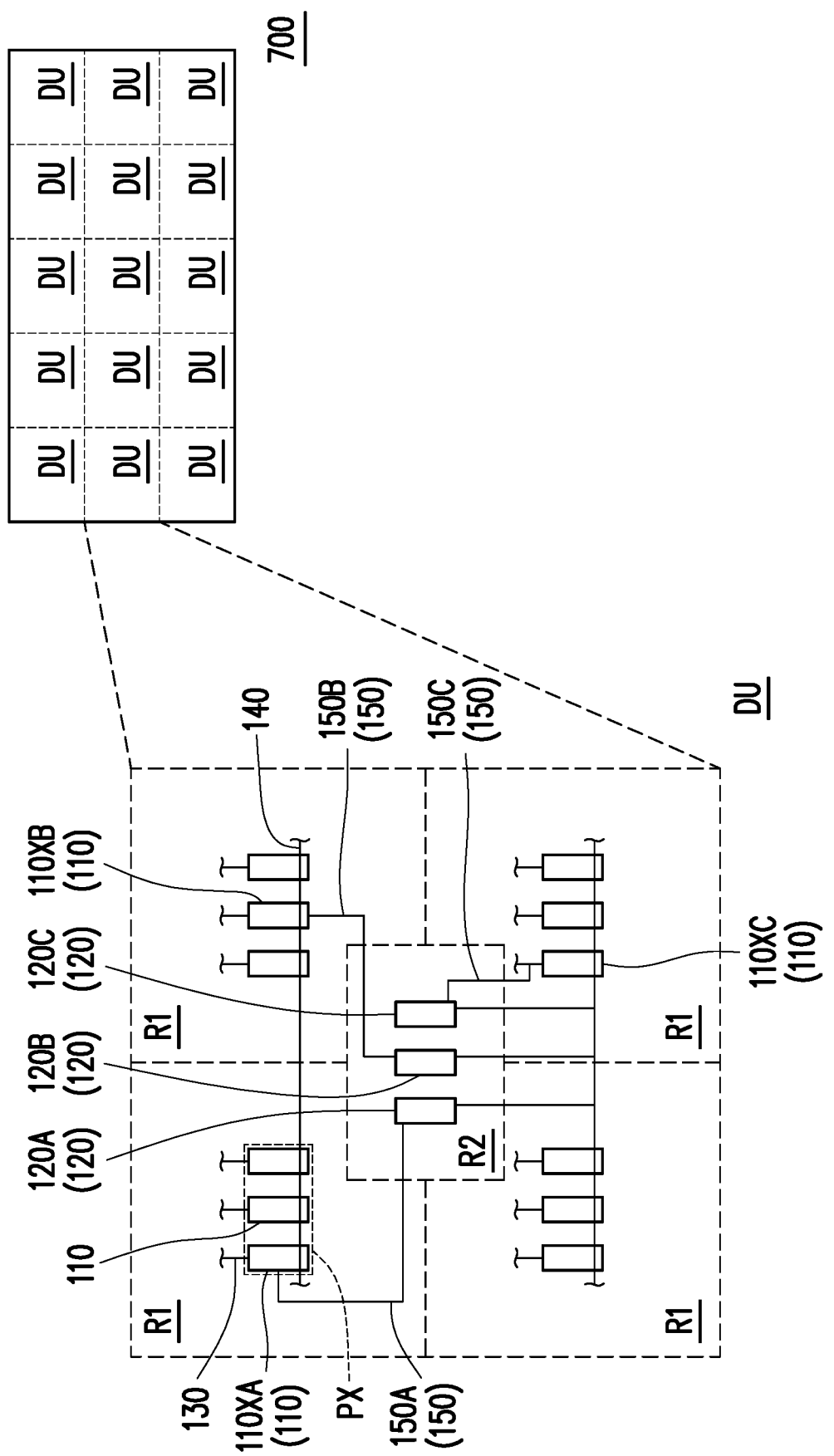
FIG. 7 is a schematic diagram illustrating a top-view of a light emitting diode panel according to yet another embodiment of the invention.

FIG. 7 is a schematic diagram illustrating a top-view of a light emitting diode panel according to yet another embodiment of the invention. In FIG. 7, a light emitting diode panel 700 is substantially similar to the light emitting diode panel 100, and includes a plurality of display units DU. Each of the display units DU is divided into the plurality of first regions R1 and the second region R2 surrounded by the plurality of first regions R1. The single display unit DU may include the plurality of first light emitting diodes 110 and the second light emitting diode 120. Every N first light emitting diode 110 in the plurality of first light emitting diodes 110 constructs one pixel unit PX, and each of the pixel units PX is disposed in one of the first regions R1. N is an integer greater than 1. The difference between this embodiment and the light emitting diode panel 100 is that a plurality of second light emitting diodes 120 is disposed in the second region R2. FIG. 7 shows an example of disposing three second light emitting diodes 120 in the single second region R2. However, the invention is not limited thereto. Moreover, the single display unit DU may further include a plurality of control signal lines 130, a plurality of common signal lines 140, and a plurality of repair lines 150. The configuration of the first light emitting diodes 110, the second light emitting diode 120, the control signal lines 130, the common signal lines 140, and the repair lines 150 may be referred to the related descriptions of FIG. 1, and shall not be repeated herein.

In the light emitting diode panel 700, three second light emitting diodes 120 disposed in the second region R2 are all configured to substitute the first light emitting diodes 110 that are invalid or not successfully transferred, so as to achieve the repair effect. Hence, in the plurality of second light emitting diodes 120 disposed in the single second region R2, different second light emitting diodes 120 may be electrically connected to different control signal lines 130, and these control signal lines 130 extend toward, for example, respective first light emitting diodes 110 that are invalid or not successfully transferred. In FIG. 7, each of the second light emitting diodes 120 is connected to one repair line 150 correspondingly, and the repair lines 150 are configured to electrically connect the second light emitting diodes 120 to the corresponding control signal lines 130. Nevertheless, in some embodiments, only a portion of the plurality of second light emitting diodes 120 in the single second region R2 may provide the repair effect, whereas the second light emitting diodes 120 not providing the repair effect may be left idle and not be connected to any repair line.

Since the second region R2 is surrounded by the plurality of first regions R1, the second light emitting diodes 120 in the second region R2 may be configured to replace any first light emitting diode 110 in the first regions R1 surrounding the second region R2. For instance, in FIG. 7, the three second light emitting diodes 120 in the second region R2 may be respectively configured to repair the first light emitting diodes 110 in three different first regions R1. For easier illustration, the three second light emitting diodes 120 here are respectively numbered as a second light emitting diode 120A, a second light emitting diode 120B, and a second light emitting diode 120C. In addition, the repair lines 150 in the display unit DU are respectively numbered as a repair line 150A, a repair line 150B, and a repair line 150C, which are respectively connected to the second light emitting diodes 120A, 120B, and 120C. The second light emitting diode 120A may be connected to a first light emitting diode 110XA through the repair line 150A, in which the first light emitting diode 110XA is in the first region R1 in the upper left corner and is invalid or not successfully transferred. The second light emitting diode 120B is connected to a first light emitting diode 110XB through the repair 150B, in which the second light emitting diode 120B is in the upper right corner and is invalid or not successfully transferred. The second light emitting diode 120C is connected to a first light emitting diode 110XC through the repair line 150C, in which the second light emitting diode 120C is in the bottom right corner and is invalid or not successfully transferred. However, the layout manner of the repair lines 150 is merely for illustration. In other embodiments, an extension path of each of the repair lines 150 may be determined according to the position of the corresponding light emitting diode that is invalid or not successfully transferred.

Each of the first light emitting diodes 110 is configured to present designated color, for example, red, green, or blue. Hence, apart from the second light emitting diodes 120 being electrically connected to the control signal lines 130 corresponding to the first light emitting diodes 110 that are invalid or not successfully transferred, the light emitted by the second light emitting diodes 120A have to present the color presented by the corresponding first light emitting diodes 110XA, 110XB, or 110XC that is invalid or not successfully transferred, so as to achieve the repair effect. For instance, if the first light emitting diode 110XA in the first region R1 in the upper left corner is configured to present blue, the corresponding second light emitting diode 120A is required to adopt the design of presenting blue light. Similarly, if the first light emitting diode 110XA that is invalid or not successfully transferred in the first region R1 in the upper left corner is configured to present red or green, the corresponding second light emitting diode 120A is required to adopt the design of presenting red or green light. Likewise, the second light emitting diodes 120B and 120C are required to have the corresponding design corresponding to the predetermined presented colors of the first light emitting diodes 110XB and 110XC.

Figure 8:
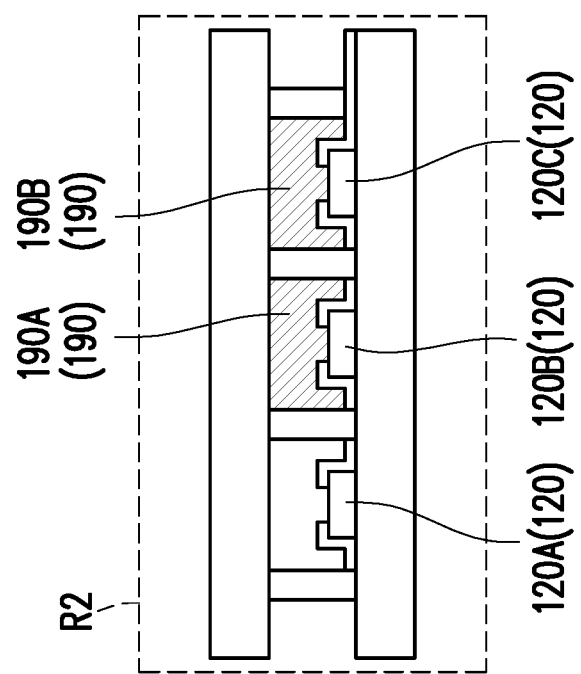
FIG. 8 is a schematic diagram illustrating a side-view of a second region of light emitting diode panel according to an embodiment of the invention.

FIG. 8 is a schematic diagram illustrating a side-view of a second region of light emitting diode panel according to an embodiment of the invention. FIG. 8 may be configured to illustrate an embodiment in which the plurality of second light emitting diodes 120 in the second region R2 of FIG. 7 may present desired colors. However, the invention is not limited thereto. Aside from the second light emitting diodes 120, in the second region R2 presented in FIG. 8, the first substrate 160, the second substrate 170, the rib 180, and the repair light modulation layers 190 are further illustrated. The configuration of the second light emitting diodes 120, the first substrate 160, the second substrate 170, the rib 180 and the repair light modulation layers 190 may be referred to the related descriptions of FIG. 4, and shall not be repeated herein. Moreover, the repair light modulation layers 190 may be replaced by the repair light modulation layer 190' of FIG. 5 to have a multilayer structure.

Specifically, the color of the light emitted by the second light emitting diode 120A is the same as the predetermined first light emitting diode 110XA (illustrated in FIG. 7). Consequently, the second light emitting diode 120A may be configured without collaborating with the repair light modulation layer 190. The color of the light emitted by the second light emitting diodes 120B and 120C and the colors predetermined to be presented by the first light emitting diodes 110XB and 110XC (as illustrated in FIG. 7), which are predetermined to be repaired, are different. Hence, the repair light modulation layers 190A and 190B are respectively stacked on the second light emitting diodes 120B and 120C.

In some embodiments, since the colors predetermined to be presented by the first light emitting diodes 110XB and 110XC (illustrated in FIG. 7), which are predetermined to be repaired by the second light emitting diodes 120B and 120C, are different. Therefore, the repair light modulation layer 190A of the second light emitting diode 120B may be different from the repair light modulation layer 190B of the second light emitting diode 120C. Nonetheless, when the first light emitting diodes 110 to be repaired by the second light emitting diodes 120B and 120C are configured to present the same color, the repair light modulation layer 190A of the second light emitting diode 120B may be the same as the repair light modulation layer 190B of the second light emitting diode 120C. Moreover, although the embodiment fails to present the side-view of the first region R1, the side-view of the first region R1 may be the same as the structure presented in FIG. 3 or FIG. 6. When the side-view of the first region R1 is the same as the structure presented in FIG. 6, a pixel light modulation layer may be stacked on the at least part of the first light emitting diodes, such that each of the first light emitting diodes may be applied to present a predetermined color after collaborating with the pixel light modulation layer. Moreover, the pixel light modulation layer may be manufactured by the same or different manufacturing manner as that of the repair light modulation layer. The detailed descriptions may be referred to the related descriptions of FIG. 6.

Figure 9:
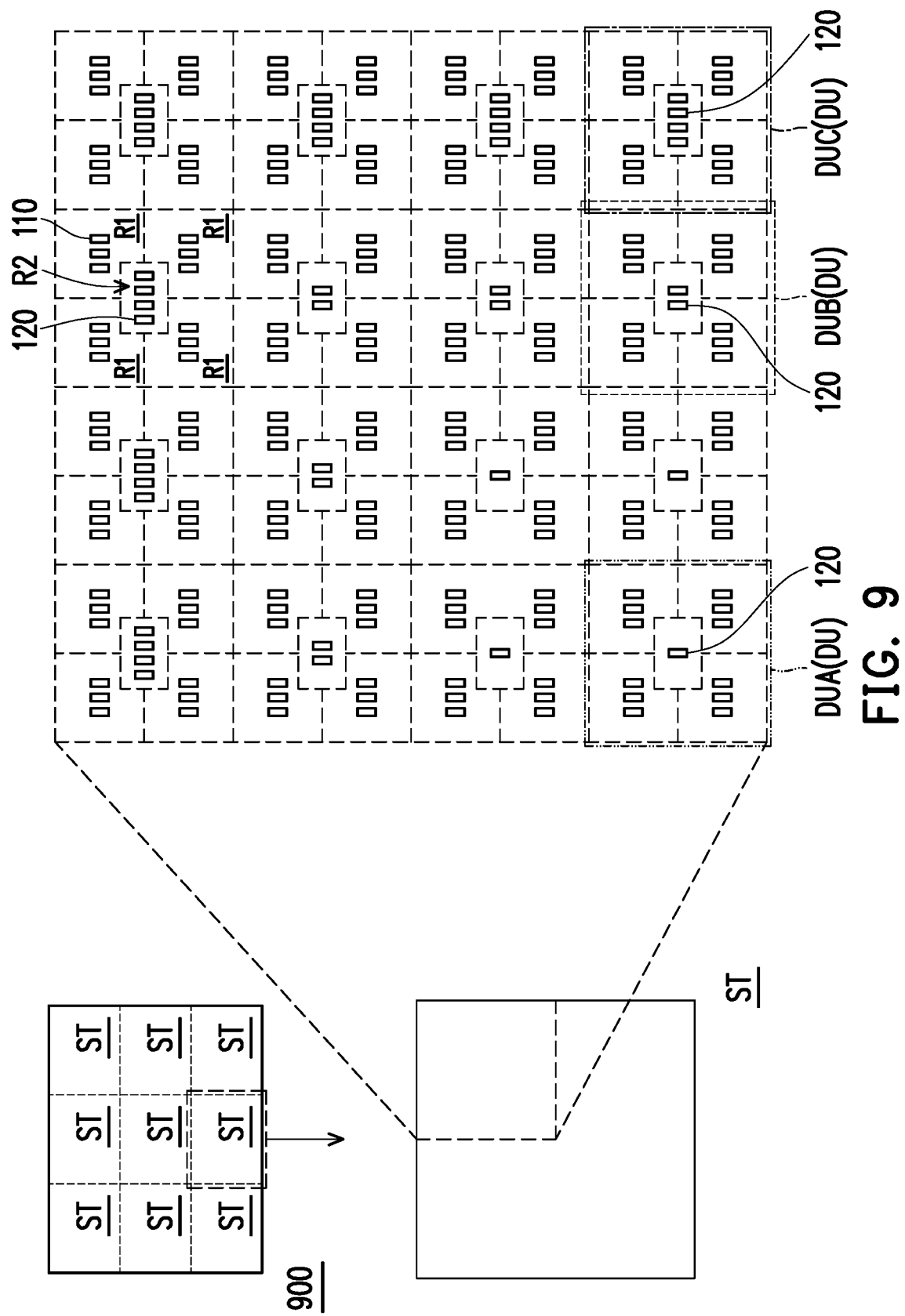
FIG. 9 is a schematic diagram illustrating a top-view of a second region of light emitting diode panel according to still another embodiment of the invention.

FIG. 9 is a schematic diagram illustrating a top-view of a second region of a light emitting diode panel according to still another embodiment of the invention. In FIG. 9, a light emitting diode panel 900 is similar to the light emitting diode panel 100 of FIG. 1. Specifically, the light emitting diode panel 900 may have a plurality of display units DU, and include a plurality of first light emitting diodes 110, a plurality of second light emitting diodes 120, and corresponding signal lines (not illustrated). Each of the display units DU is divided into a plurality of first regions R1 and a second region R2 surrounded by the plurality of first regions R1 according to the arrangement of the first light emitting diodes 110 and the second light emitting diodes 120. Specifically, in the top view, the arrangement of the first light emitting diodes 110, the second light emitting diodes 120, the first regions R1, the second regions R2, and the display unit DU may be referred to the related descriptions of FIG. 1.

In this embodiment, the first light emitting diodes 110 and the second light emitting diodes 120 are collectively transferred onto the substrate of the light emitting diode panel 900 (not illustrated) by a batch transfer process. In FIG. 9, a plurality of transition regions ST on the light emitting diode panel 900 is illustrated. Each of the transition regions ST may correspond to the size of the transfer fixture. Each of the transition regions ST may be understood as a region that all of the light emitting diodes in this region are transferred onto the substrate of the light emitting diode panel 900 under the same transfer step.

In this embodiment, one single transition region ST may include a plurality of display units DU. In addition, the number of the second light emitting diodes 120 in different display units DU may be different. For example, in the enlarged partial region of the single transition region ST shown in FIG. 9, display units DUA, DUB and DUC are arranged in order from the center of the transition region ST to the periphery of the transition region ST. Here, one second light emitting diode 120 is disposed in the display unit DUA, two second light emitting diodes 120 are disposed in the display unit DUB, and four second light emitting diodes 120 are disposed in the display unit DUC. In this way, the display unit DUC located at the periphery of the transition region ST provides more of the second light emitting diodes 120 for repairing. However, the invention is not limited thereto. In other embodiments, more of the second light emitting diodes may be disposed in certain region of the transfer region ST while the light emitting diodes disposed in said region may be relatively easy to be invalid or not successfully transferred. It is not limited that more second light emitting diodes are disposed in the transfer region ST. Moreover, the light emitting diode panel 900 of FIG. 9 having the plurality of transfer regions ST is merely for illustrative purposes. In other embodiments, the light emitting diode panel may have a smaller display region and include only a single transition region. Namely, all the light emitting diodes in such light emitting diode panel are transferred onto the substrate under one same batch transfer process. Specifically, the number of the transition region in the light emitting diode panel changes along with the size of the display region of the light emitting diode panel, and is not limited to multiple or single.

Figure 10:
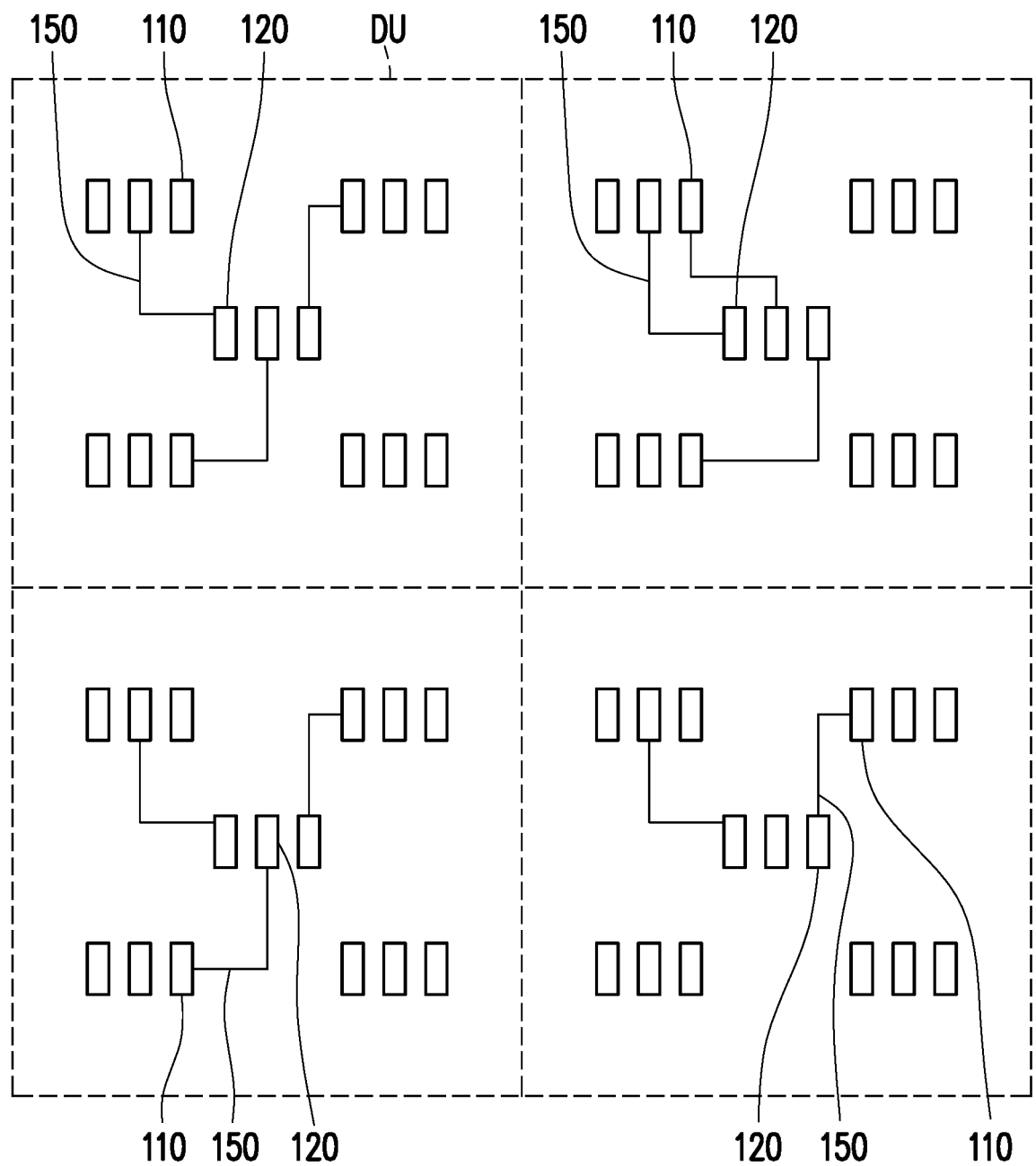
FIG. 10 is a schematic diagram illustrating a partial top-view of a light emitting diode panel according to still another embodiment of the invention.

FIG. 10 is a schematic diagram illustrating a partial top-view of a light emitting diode panel according to still another embodiment of the invention. It is illustrated in FIG. 10 that the top-view of the four display units DU in a light emitting diode panel 1000, and FIG. 10 omits the control signal lines and the common signal line. However, the omitted components may refer to the relevant description of FIG. 1. Specifically, each of the display units DU includes a plurality of first light emitting diodes 110, a plurality of second light emitting diodes 120, a the plurality of repair lines 150. The configurations of the first light emitting diodes 110 and the second light emitting diodes 120 may be referred to the related descriptions of FIG. 7. The repair lines 150 of FIG. 10 are merely illustratively indicated to be connected between respective second light emitting diodes 120 and the corresponding repaired first light emitting diodes 110. However, the specific connecting manner of the repair line 150 may be referred to that depicted in FIG. 7. It may be acquired from FIG. 10 that relative positions of the second light emitting diodes 120 and the corresponding repaired first light emitting diodes 110 in the different display units DU are different. Furthermore, in the display unit DU in the bottom right corner in FIG. 10, one of the second light emitting diodes 120 is not configured to repair any of the first light emitting diodes 110 and is left idle.

Figure 11:
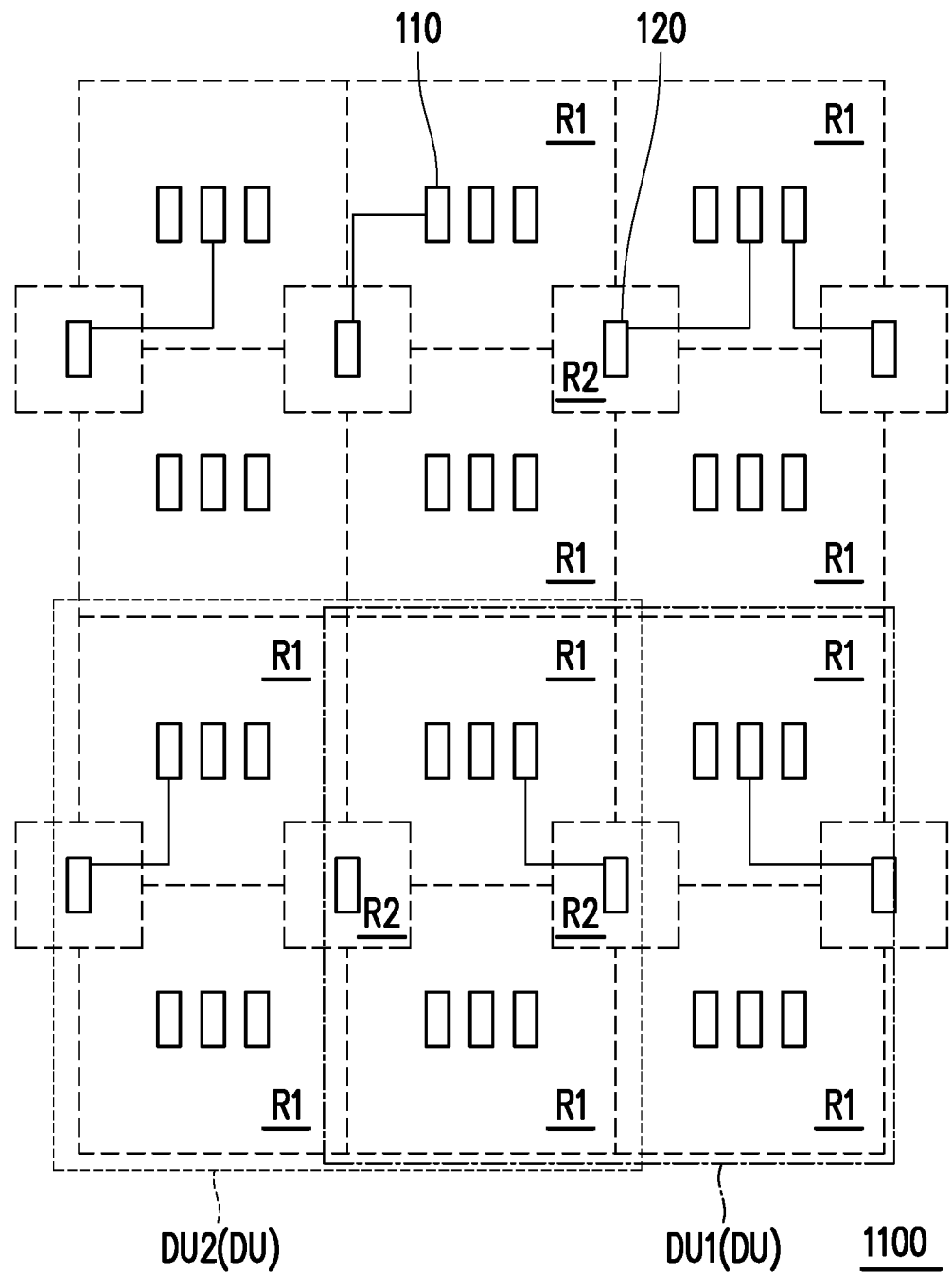
FIG. 11 is a schematic diagram illustrating a partial top-view of a light emitting diode panel according to yet another embodiment of the invention.

FIG. 11 is a schematic diagram illustrating a partial top-view of a light emitting diode panel according to yet another embodiment of the invention. In FIG. 11, the top-view of the four display units DU in the light emitting diode panel 1000 is shown, and the control signal lines and the common signal line are omitted in FIG. 10 for clear illustration. The arrangement of a plurality of first regions R1 and a plurality of second regions R2 in the light emitting diode panel 1100 may be presented in FIG. 11. In this embodiment, a plurality of first light emitting diodes 110 are disposed in each of the first regions R1, and a second light emitting diode 120 is disposed in each of the second regions R2. However, in other embodiments, a plurality of second light emitting diode 120 may be disposed in each of the second regions R2. In addition, the plurality of first regions R1 and the plurality of second regions R2 in the light emitting diode panel 1100 may be arranged, for example, in an array manner, respectively. The number of columns of the array of the first region R1 is the same as that of the second region R2, yet the number of rows of the array of the second region R2 is smaller than that of the first region R1. In addition, the second regions R2 may not be disposed between certain two columns of the first regions R1. As such, each of the first regions R1 may share one second region R2 with the adjacent first region R1 on the right side or share one second region R2 with the adjacent first region R1 on the left side.

When the plurality of first regions R1 surrounding a single region R2 are defined as one display unit DU, the display unit DU1 and the display unit DU2 may include the same first regions R1.

Figure 12:
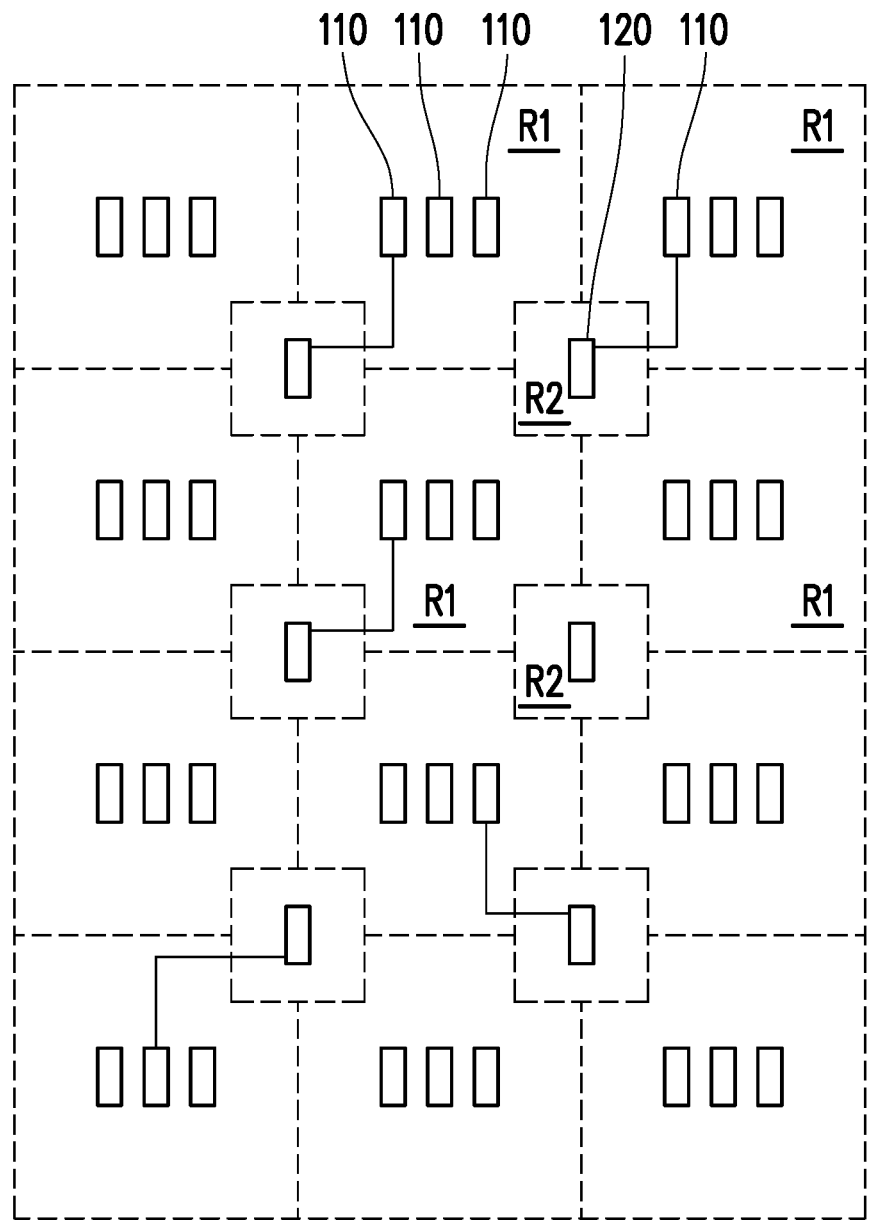
FIG. 12 is a schematic diagram illustrating a partial top-view of a light emitting diode panel according to still another embodiment of the invention.

FIG. 12 is a schematic diagram illustrating a partial top-view of a light emitting diode panel according to still another embodiment of the invention. The arrangement of a plurality of first regions R1 and a plurality of second regions R2 in the light emitting diode panel 1200 may be presented in FIG. 12. The second regions R2 of the light emitting diode panel 1200 are distributed in a higher density than that of the light emitting diode panel 1100. Specifically, the plurality of first regions R1 and the plurality of second regions R2 in the light emitting diode panel 1200 may be arranged, for example, in an array manner, respectively. In this way, two of the first regions R1 adjacent to each other in the row direction may share one second region R2 and two of the first regions R1 adjacent to each other in the column direction may also share one second region R2. In the embodiments of FIG. 11 and FIG. 12, merely one second light emitting diode 120 is disposed in each of the second regions R2. However, the invention is not limited thereto. In other embodiments, a plurality of second light emitting diodes may be disposed in each of the second regions R2, and different second regions R2 may be disposed with different numbers of the second light emitting diodes.

Figure 13:
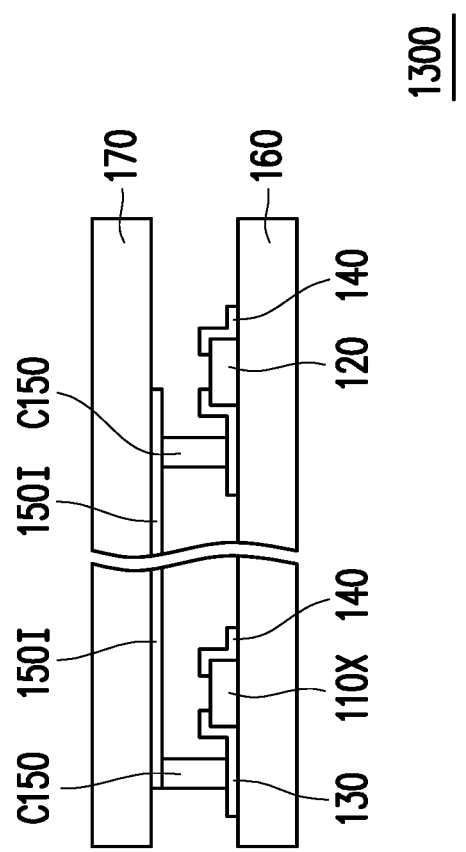
FIG. 13 is a schematic diagram illustrating a partial side-view of a light emitting diode panel according to still another embodiment of the invention.

FIG. 13 is a schematic diagram illustrating a partial side-view of a light emitting diode panel according to still another embodiment of the invention. FIG. 13 is configured to illustrate an exemplary embodiment in which the second light emitting diode in the light emitting diode panel is connected to the first light emitting diode that is invalid or not successfully transferred through the corresponding repair line. Therefore, for easier illustration, FIG. 13 omits some components of the light emitting diode panel. The design of the repair line presented in FIG. 13 may be applied to the repair line described in any of the aforementioned embodiments. Specifically, in FIG. 13, a light emitting diode panel 1300 includes a first light emitting diode 110X, a second light emitting diode 120, a control signal lines 130, a common signal line 140, a repair line 150I, a first substrate 160, and a second substrate 170. The first light emitting diode 110X is, for example, the light emitting diode that is invalid or not successfully transferred. Accordingly, the second light emitting diode 120 in this embodiment is connected to be corresponded to the control signal lines 130 of the first light emitting diode 110X through the repair line 150I, such that the second light emitting diode 120 may substitute the first light emitting diode 110X.

The first substrate 160 is assembled up and down with the second substrate 170. The first light emitting diode 110X, the second light emitting diode 120, the control signal line 130, the common signal line 140 are all disposed on the first substrate 160. The repair line 150I is disposed on the second substrate 170. Besides, the light emitting diode panel 1300 further includes a connector C150. The connector C150 is disposed between the first substrate 160 and the second substrate 170, and the number of the connector C150 is two. One of the connectors C150 is connected between the repair line 150I and the second light emitting diode 120, and the other connector C150 is connected between the repair line 150I and one control signal line 130 corresponding to the first light emitting diode 110X. That is, the repair line of the invention may be disposed on the first substrate 170 disposed with the light emitting diodes as illustrated in FIG. 3 or on the second substrate 170 having no light emitting diode as illustrated in FIG. 13. In FIG. 13, although the control signal line 130 continuously extends to be connected to the first light emitting diode 110X, in other embodiments, the control signal line 130 may be broken off between the connecting point at which the connector C150 is connected to the control signal line 130 and the first light emitting diode 110X.

Figure 14:
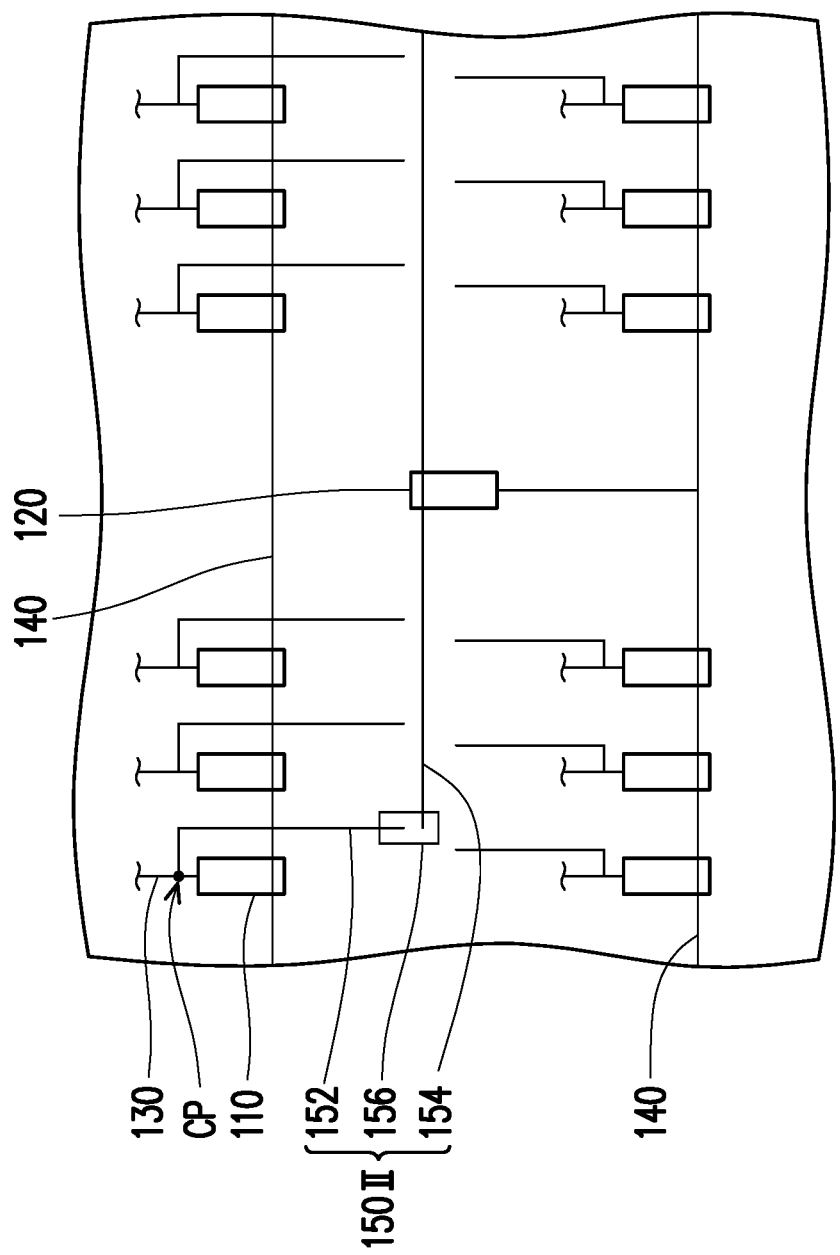
FIG. 14 is a schematic diagram illustrating a circuit layout of a single display unit of the light emitting diode panel according to an embodiment of the invention.

FIG. 14 is a schematic diagram illustrating a circuit layout of a single display unit of the light emitting diode panel according to an embodiment of the invention. In FIG. 14, the display unit DU includes a plurality of first light emitting diodes 110, a second light emitting diode 120, a plurality of control signal lines 130, a plurality of common signal line 140, and a repair line 150II. The configuration of the first light emitting diodes 110, the second light emitting diode 120, the control signal lines 130, and the common signal line 140 may be referred to the aforementioned embodiment, and are not repeated herein. Here, the repair line 150II may be configured to connect the second light emitting diode 120 to one of the control signal lines 130 connected to the first light emitting diode 110, and the repair line 150II includes a first line segment 152, a second line segment 154, and a connection structure 156. One of the first line segments 152 and the second line segment 154 is connected to one of the control signal lines 130. The other of the first line segment 152 and the second line segment 154 is connected to the second light emitting diode 120, and the connection structure 156 is connected between the first line segment 152 and the second line segment 154. Specifically, the embodiment is illustrated as the first line segment 152 is connected to the control signal line 130, and the second line segment 154 is connected to the second light emitting diode 120.

The first line segment 152 and the second line segment 154 may be circuits premanufactured on the substrate of the light emitting diode panel. In some embodiments, the first line segment 152 and the second line segment 154 may be made of the same film layer as the control signal lines 130. However, the invention is not limited thereto. Furthermore, the number of the first line segment 152 may be the same as the number of the first light emitting diode 110, and the first line segments 152 are not in direct connected to the second line segment 154. After detecting the first light emitting diode 110 that is invalid or not successfully transferred in the display unit DU, the connection structure 156 is further formed, such that first line segment 152 corresponding to the first light emitting diode 110 that is invalid or not successfully transferred is connected to the second line segment 154 to achieve repair. At this time, other first line segments 152 are still not connected to the second line segment 154. Furthermore, similar to FIG. 2, the control signal lines 130 are broken off between the connection point CP at which the repair line 150II is connected to the control signal lines 130 and the corresponding first light emitting diode 110. The structure of the repair line 150II may be applied to any one of the aforementioned light emitting diode panels 100-1200 as one possible embodiment of the aforementioned repair line 150.

Figure 15:
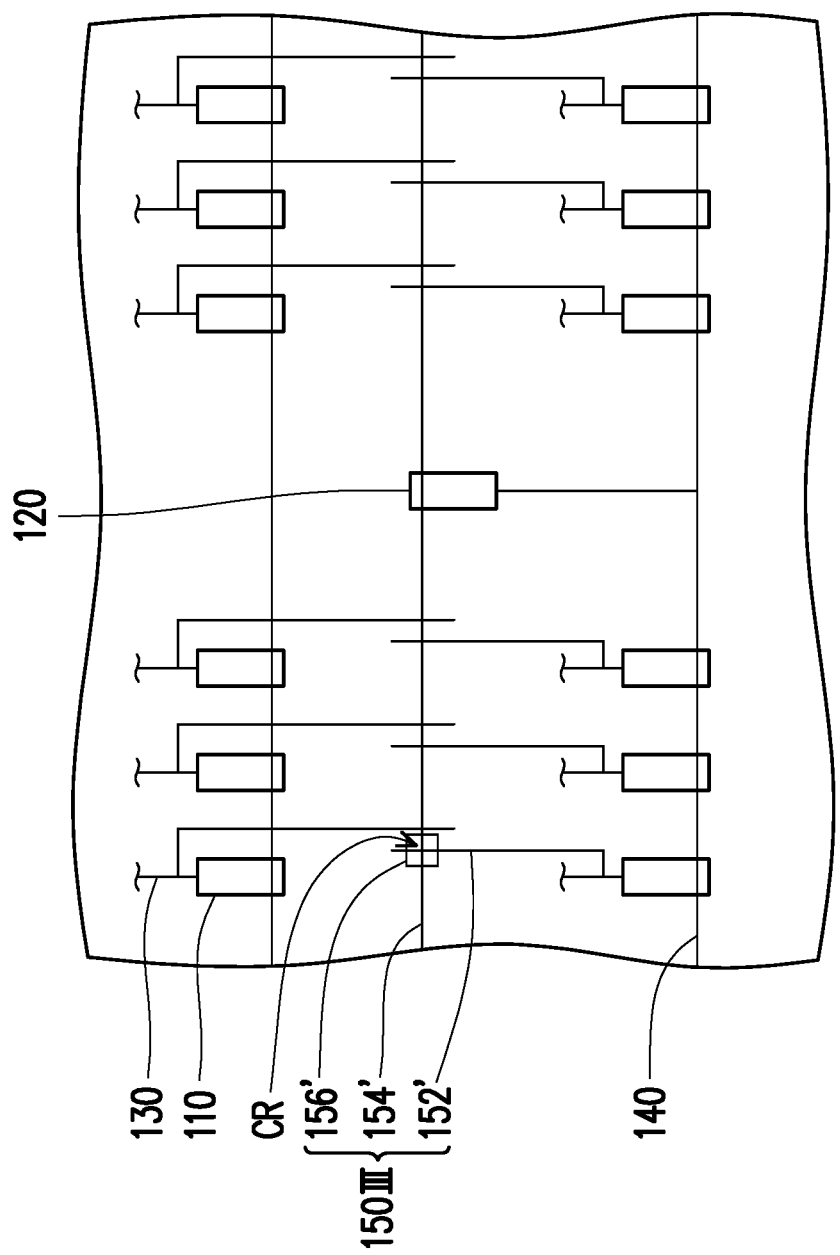
FIG. 15 is a schematic diagram illustrating a circuit layout of a single display unit of the light emitting diode panel according to an embodiment of the invention.

FIG. 15 is a schematic diagram illustrating a circuit layout of a single display unit of the light emitting diode panel according to an embodiment of the invention. In FIG. 15, a display unit DU includes a plurality of first light emitting diodes 110, a second light emitting diode 120, a plurality of control signal lines 130, a plurality of common signal lines 140, and a repair line 150III. The configurations of the first light emitting diodes 110, the second light emitting diode 120, the control signal lines 130, and the common signal lines 140 may be referred to the aforementioned embodiments, and are not repeated herein. Here, the repair line 150III may be another embodiment of the repair line 150 of the aforementioned embodiment. Specifically, the repair line 150III, similar to the repair line 150II, includes a first line segment 152', a second line segment 154' and a connection structure 156'. The main difference between the repair line 150III and the repair line 150II is that the first line segment 152' and the second line segment 154' are intersected with each other but are not directly connected, whereas the connection structure 156' is disposed at an intersection CR of the first line segment 152' and the second line segment 154' to connect the first line segment 152' and the second line segment 154'.

Figure 16:
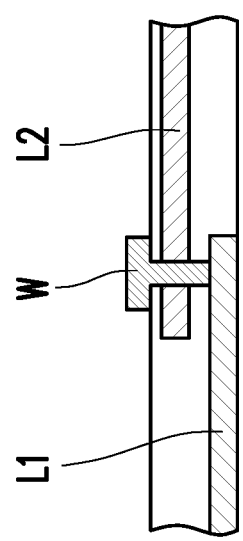
FIG. 16 is a schematic diagram illustrating a repair line 150 III of an embodiment of the invention.

FIG. 16 is a schematic diagram illustrating a repair line 150III of an embodiment of the invention. The repair line 150III may be constructed by the first conductive layer L1, the second conductive layer L2, and a welding structure W. Specifically, the first line segment 152' of the repair line 150III in FIG. 15 may be constructed by one of the first conductive layer L1 and the second conductive layer L2, and the second line segment 154' is constructed by the other of the first conductive layer L1 and the second conductive layer L2. That is, the film layer of the first line segment 152' is different from the film layer of the second line segment 154'. The welding structure W constructs the connection structure 156' in FIG. 15. It may be acquired from FIG. 16 that the first conductive layer L1 and the second conductive layer L2 are different film layers. The welding structure W is a conductive connector connected between different film layers. As such, although the first line segment 152' and the second line segment 154' are intersected with each other, they are not directly connected.

Figure 17:
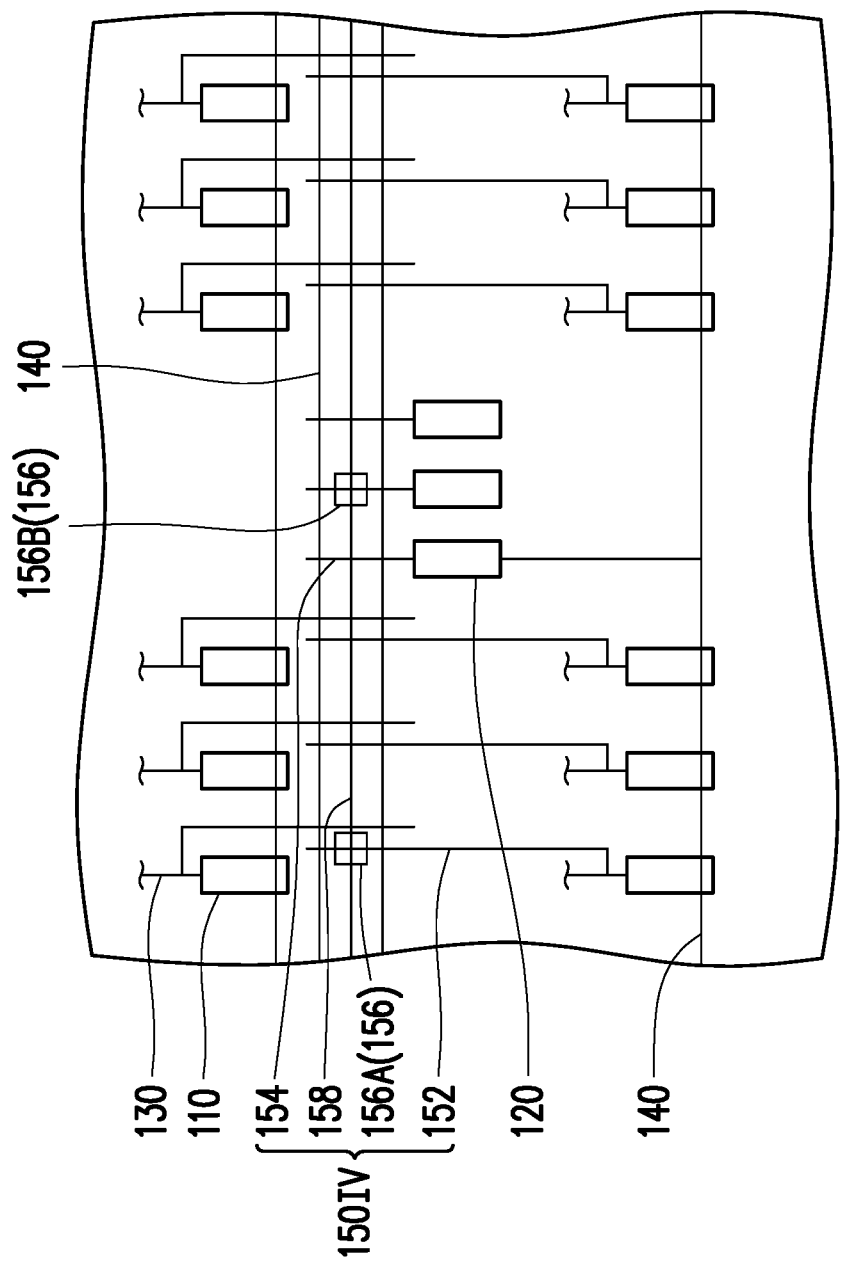
FIG. 17 is a schematic diagram illustrating a circuit layout of a single display unit of the light emitting diode panel according to another embodiment of the invention.

FIG. 17 is a schematic diagram illustrating a circuit layout of a single display unit of the light emitting diode panel according to another embodiment of the invention. In FIG. 17, a display unit DU includes a plurality of first light emitting diodes 110, a second light emitting diode 120, a plurality of control signal lines 130, a plurality of common signal lines 140, and a repair line 150IV. The configuration of the first light emitting diodes 110, the second light emitting diode 120, the control signal lines 130, and the common signal lines 140 may be referred to the aforementioned embodiments, and shall not repeated herein. Here, apart from the first line segment 152, the second line segment 154, and the connection structure 156, the repair line 150IV further includes a third line segment 158. Specifically, the plurality of first line segments 152, the plurality of second line segments 154 and the plurality of second light emitting diodes 120 are disposed in the display unit DU of this embodiment. Each of the first line segments 152 is connected to one of the control signal lines 130, and each of the second lines segments 154 is connected to one of the second light emitting diodes 120.

Moreover, the repair line 150IV of this embodiment further includes a third line segment 158. In the display unit DU, the number of the third line segment 158 is multiple, and each of the third line segments 158 crosses over the first line segments 152 and the second line segments 154. Specifically, the number of the third line segment 158 may be equivalent to the number of the second light emitting diode 120. The connection structure 156 is configured to be electrically connected to the control signal line 130 corresponding to the first light emitting diode 110 to be repaired and one of the second light emitting diodes 120. Here, the connection structure 156 includes a connection structure 156A connecting one of the first line segments 152 to the corresponding third line segment 158 and a connection structure 156B connecting one of the second line segments 154 to the corresponding third line segment 158. The configuration of the connection structures 156A and 156B in FIG. 17 are merely for illustrative purposes. In other embodiments, the configuration of the connection structures 156A and 156B may be determined according to the configuration of the first light emitting diode 110 to be repaired and the corresponding configuration of the second light emitting diode 120 providing the repair effect.

In this embodiment, the third line segment 158 may not be directly connected to the first line segment 152 or the second line segment 154. In addition, each of the first line segments 152 is not connected with each other. However, the invention is not limited thereto. In other embodiments, the third line segment 158 may be directly connected to the first line segment 152 or the second line segment 154. After the connection structure 156 is manufactured, a breaking off step may be further proceeded, for example, a laser cut. The first line segment 152 or the second line segment 154 that is unnecessary to be connected to the third line segment 158 are broken off, so as to establish the necessary electrical connection path. In other possible embodiments, the first line segment 152, the second line segment 154, and the third line segment 158 may be directly connected with each other. After detecting the first light emitting diode 110 that is invalid or not successfully transferred in the display unit DU, a repair line cutting step is proceeded, such that the first line segment 152, the second line segment 154, and the third line segment 158 that are unnecessary to be connected are broken off.

In summary of the above, in the light emitting diode panel in accordance with the embodiment of the invention, the display unit is divided into the plurality of first regions and the second region surrounded by the plurality of first regions. A plurality of first light emitting diodes is disposed in each of the first regions. One or a plurality of second light emitting diode are disposed on the second region, and the second light emitting diode disposed in the second region is the light emitting diode configured to provide the repair effect. The second light emitting diode may be collaborated with the repair light modulation layer to present the predetermined color of the first light emitting diode to be repaired. Moreover, the second light emitting diode may be configured to repair any one of the first light emitting diodes disposed in the plurality of first regions surrounding the second light emitting diode. Accordingly, the light emitting diode panel in accordance with the embodiment of the invention may have a repair structure to achieve high repair rate, and the yield of the light emitting diode panel is thus enhanced.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A light emitting diode panel, comprising:
a first substrate;
a second substrate, assembled up and down with the first substrate;
a plurality of display units, disposed between the first substrate and the second substrate, wherein one of the display units has a plurality of first regions and a second region surrounded by the plurality of first regions, and comprises:
a plurality of first light emitting diodes, disposed on the first substrate, and every N first light emitting diodes constructing one pixel unit, and each of the pixel units located within one of the first regions, wherein N is an integer greater than 1;

a plurality of control signal lines, disposed on the first substrate, extending toward the plurality of first light emitting diodes respectively; and a second light emitting diode, disposed on the first substrate, located within the second region, and surrounded by the plurality of first regions; and a rib, disposed on the second substrate, and located between the first substrate and the second substrate, wherein the second light emitting diode is electrically connected to one of the control signal lines, and one of the display units further comprises a repair line and a repair light modulation layer, wherein the repair line extends from the second region to any one of the first regions of the one of the display units and connects one of the control signal lines extending toward the any one of the first regions of the one of the display units and the second light emitting diode, the repair light modulation layer is disposed between the second substrate and the second light emitting diode, and the rib surrounds the repair light modulation layer.

2. The light emitting diode panel as claimed in claim 1, wherein the one of the control signal lines is broken off between a connection point at which the one of the control signal lines is connected to the repair line and the one of the first light emitting diodes.

3. The light emitting diode panel as claimed in claim 1, wherein the repair line is disposed on the second substrate, and the light emitting diode panel further comprises a connector connected between the repair line and the second light emitting diode, and between the one of the control signal lines and the repair line.

4. A light emitting diode panel, comprising:
a first substrate;
a second substrate, assembled up and down with the first substrate; and
a plurality of display units, disposed between the first substrate and the second substrate, wherein one of the display units has a plurality of first regions and a second region surrounded by the plurality of first regions, and comprises:
a plurality of first light emitting diodes, disposed on the first substrate, and every N first light emitting diodes constructing one pixel unit, and each of the pixel units located within one of the first regions, wherein N is an integer greater than 1;
a plurality of control signal lines, disposed on the first substrate, extending toward the plurality of first light emitting diodes respectively; and
a second light emitting diode, disposed on the first substrate, located within the second region, and surrounded by the plurality of first regions, wherein the second light emitting diode is electrically connected to one of the control signal lines, and one of the display units further comprises a repair line, wherein the repair line extends from the second region to any one of the first regions of the one of the display units and connects one of the control signal lines extending toward the any one of the first regions of the one of the display units and the second light emitting diode, wherein the repair line comprises a first line segment, a second line segment and a connection structure, one of the first line segment and the second line segment is connected to the one of the control signal lines, the other one of the first line segment and the second line segment is connected to the second light emitting diode, the connection structure connects the first line segment to the second line segment, a film layer of the first line segment is different from a film layer of the second line segment, the first line segment and the second line segment are intersected, and the connection structure comprises a welding structure located at an intersection of the first line segment and the second line segment.

5. A light emitting diode panel, comprising:
a first substrate;
a second substrate, assembled up and down with the first substrate; and
a plurality of display units, disposed between the first substrate and the second substrate, wherein one of the display units has a plurality of first regions and a second region surrounded by the plurality of first regions, and comprises:
a plurality of first light emitting diodes, disposed on the first substrate, and every N first light emitting diodes constructing one pixel unit, and each of the pixel units located within one of the first regions, wherein N is an integer greater than 1;
a plurality of control signal lines, disposed on the first substrate, extending toward the plurality of first light emitting diodes respectively; and
a second light emitting diode, disposed on the first substrate, located within the second region, and surrounded by the plurality of first regions, wherein the second light emitting diode is electrically connected to one of the control signal lines, and one of the display units further comprises a repair line, wherein the repair line extends from the second region to any one of the first regions of the one of the display units and connects one of the control signal lines extending toward the any one of the first regions of the one of the display units and the second light emitting diode, wherein the repair line comprises a first line segment, a second line segment, a third line segment and a connection structure, one of the first line segment and the second line segment is connected to the one of the control signal lines, the other one of the first line segment and the second line segment is connected to the second light emitting diode, the connection structure connects the first line segment to the second line segment, the third line segment crosses the first line segment and the second line segment, the connection structure connects the first line segment to the third line segment, and connects the second line segment to the third line segment.

6. The light emitting diode panel as claimed in claim 1, wherein the second light emitting diode is a white light emitting diode, and the repair light modulation layer comprises a color filter layer.

7. The light emitting diode panel as claimed in claim 1, wherein the second light emitting diode is a blue light emitting diode or an ultraviolet light emitting diode, and the repair light modulation layer comprises a wavelength conversion layer.

8. The light emitting diode panel as claimed in claim 7, wherein the repair light modulation layer further comprises a color filter layer.

9. The light emitting diode panel as claimed in claim 1, further comprising a pixel light modulation layer disposed on the second substrate, and stacked on the one of the first light emitting diodes.

10. The light emitting diode panel as claimed in claim 1, wherein a corresponding first light emitting diode to which the one of the control signal lines is connected is an invalid light emitting diode.

11. The light emitting diode panel as claimed in claim 1, wherein a number of the second light emitting diode included in the one of the display units is multiple, and different second light emitting diodes are electrically connected to different ones of the control signal lines.

12. The light emitting diode panel as claimed in claim 1, wherein different ones of the display units include different numbers of the second light emitting diode.

* * * * *